United States Patent
Jung

(10) Patent No.: US 9,530,735 B2
(45) Date of Patent: Dec. 27, 2016

(54) SEMICONDUCTOR DEVICE AND METHOD OF MANUFACTURING THE SAME

(71) Applicant: SK hynix Inc., Gyeonggi-do (KR)

(72) Inventor: Woo Yung Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/164,572

(22) Filed: May 25, 2016

(65) Prior Publication Data

US 2016/0307846 A1 Oct. 20, 2016

Related U.S. Application Data

(62) Division of application No. 14/850,284, filed on Sep. 10, 2015, now Pat. No. 9,379,133.

(30) Foreign Application Priority Data

Apr. 17, 2015 (KR) ........................ 10-2015-0054747

(51) Int. Cl.

| H01L 29/66 | (2006.01) |
|---|---|
| H01L 23/528 | (2006.01) |
| H01L 27/115 | (2006.01) |
| H01L 23/522 | (2006.01) |
| H01L 21/768 | (2006.01) |

(52) U.S. Cl.
CPC ..... *H01L 23/5283* (2013.01); *H01L 21/76816* (2013.01); *H01L 21/76877* (2013.01); *H01L 23/5226* (2013.01); *H01L 27/1157* (2013.01); *H01L 27/11582* (2013.01)

(58) Field of Classification Search
CPC ............ H01L 27/11582; H01L 27/1157; H01L 27/11514; H01L 27/11551; H01L 27/11568; H01L 23/5226; H01L 23/528; H01L 23/5283; H01L 23/535; H01L 21/0274; H01L 21/32139; H01L 21/76816; H01L 21/76892; H01L 21/76897
USPC ........................................................ 257/329
See application file for complete search history.

(56) References Cited

U.S. PATENT DOCUMENTS 9,165,774 B2 * 10/2015 Oh .................... H01L 21/28008

\* cited by examiner

*Primary Examiner* — Tu-Tu Ho
(74) *Attorney, Agent, or Firm* — IP & T Group LLP

(57) ABSTRACT

A method of manufacturing a semiconductor device includes forming stepped stack structures each including conductive patterns stacked in a shape of steps while exposing respective ends thereof and surrounding channel layers, the stepped stack structures being separated from one another by slits, forming first and second contact plugs connected to the ends of the conductive patterns to extend along an extending direction of the channel layers, and simultaneously forming, using a spacer patterning technology (SPT), bit lines connected to one or more of the channel layers and extending along a first direction, first connecting lines extending along a second direction intersecting the first direction, and contact pads extending from the first connecting lines to be connected to the first contact plugs.

8 Claims, 18 Drawing Sheets

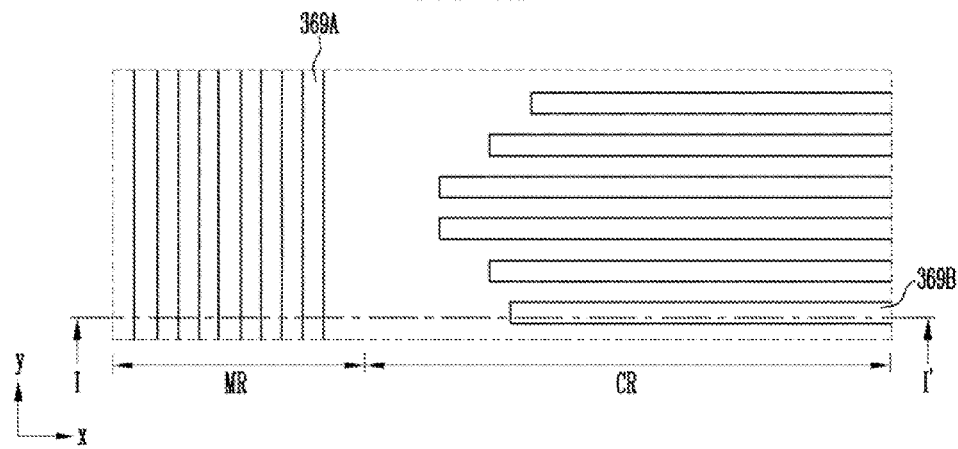
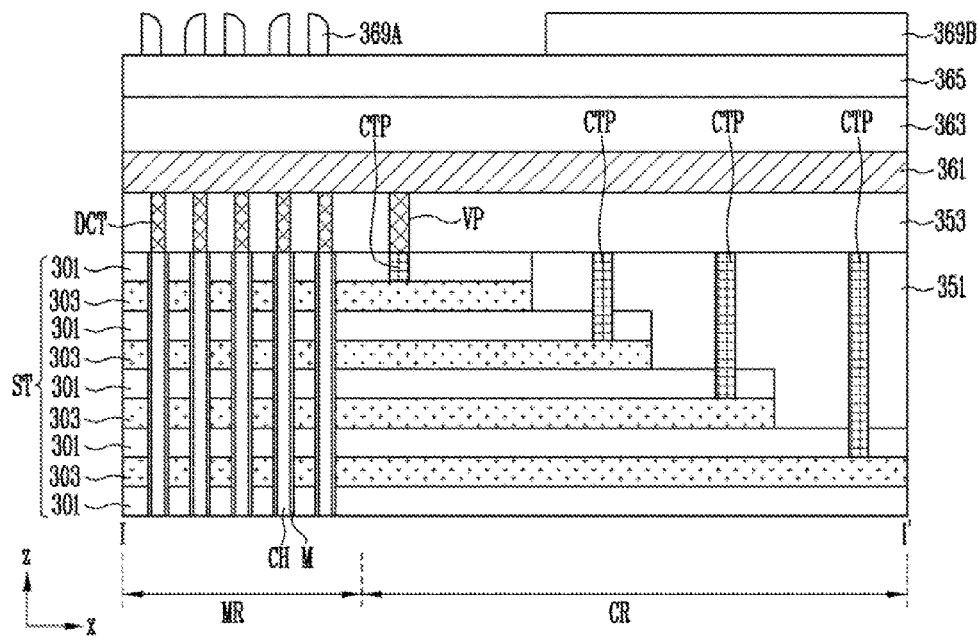

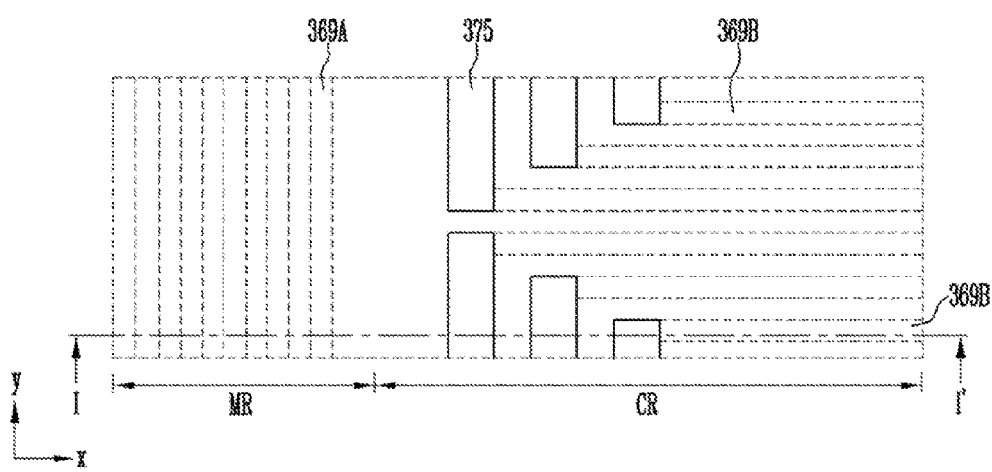

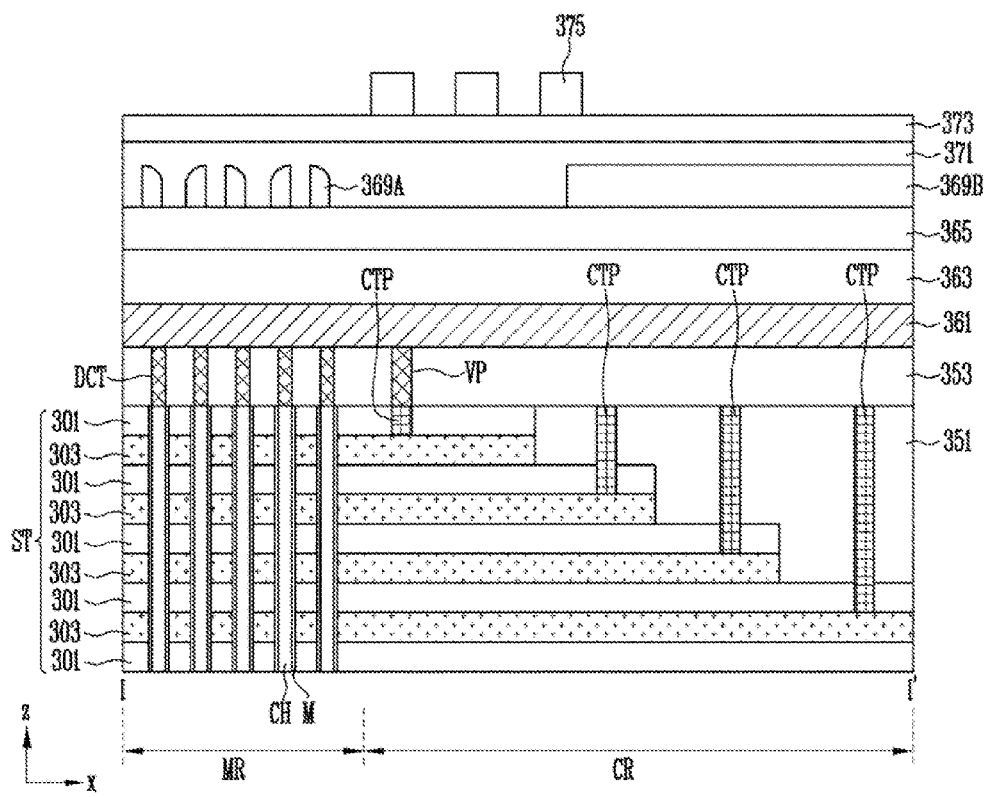

SEMICONDUCTOR DEVICE AND METHOD OF MANUFACTURING THE SAME

CROSS-REFERENCE TO RELATED APPLICATION

This application is a division of U.S. patent application Ser. No. 14/850,284 filed on Sep. 10, 2015, which claims priority to Korean patent application number 10-2015-0054747, filed on Apr. 17, 2015. The entire disclosure of each of the foregoing applications is herein incorporated by reference in its entirety.

BACKGROUND

1. Field

Exemplary embodiments of the present invention relate to a semiconductor device and a method of manufacturing the same and, more particularly, to a three-dimensional semiconductor device and a method of manufacturing the same.

2. Description of the Related Art

Semiconductor devices have been developed with various structures to increase integration. This includes semiconductor devices having three-dimensional memory devices.

Memory cells of a three-dimensional memory device are connected to word lines and are stacked on a semiconductor substrate. Each of the word lines may be formed in a memory array area and extend to a contact area. Each of the word lines may be electrically connected to a switching device in the peripheral area via a contact plug and a connecting line. The switching device may control whether an operating voltage is applied to the word lines.

Connecting lines may be connected to contact plugs formed in the contact area and extend toward the peripheral area where the switching devices are. As the number of stacked word lines in the third-dimensional memory device increases, the number of connecting lines connected to the word lines may increase. The connecting lines are formed in a memory block, which is limited in size. Due to its limited size, it is difficult keep increasing the number of connecting lines in the memory block. In order to solve this problem, there is a method of increasing the number of conductive layers for the connecting lines. Unfortunately, this requires an increased number of mask processes for forming the connecting lines, which increases manufacturing costs.

SUMMARY

Embodiments provide a semiconductor device and a method of manufacturing the same, which can decrease the number of mask processes and reduce the manufacturing cost of semiconductor devices.

According to an embodiment of the present invention, there is provided a semiconductor device including stepped stack structures each including first to nth conductive patterns sequentially stacked while forming steps and exposing respective ends thereof, the stepped stack structures being separated from one another by slits and arranged along a first direction to constitute a memory block, wherein the n is a natural number, first connecting lines disposed on the stepped stack structures, and spaced apart from one another along the first direction, while extending along a second direction intersecting the first direction, wherein one end of the first connecting lines further protrude in the second direction as the first connecting lines are more distant from first stepped stacked structures at outermost portions of the memory block among the stepped stack structures, and contact pads extending along the first direction from the one ends of the first connecting lines to overlap the first stepped stack structures.

According to an embodiment of the present invention, there is provided a method of manufacturing a semiconductor device, the method including forming stepped stack structures each including conductive patterns stacked in a shape of steps while exposing respective ends thereof and surrounding channel layers, the stepped stack structures being separated from one another by slits, forming first and second contact plugs connected to the ends of the conductive patterns to extend along an extending direction of the channel layers, and simultaneously forming, using a spacer patterning technology (SPT), bit lines connected to one or more of the channel layers and extending along a first direction, first connecting lines extending along a second direction intersecting the first direction, and contact pads extending from the first connecting lines to be connected to the first contact plugs.

BRIEF DESCRIPTION OF THE DRAWINGS

Embodiments will now be described more fully hereinafter with reference to the accompanying drawings; however, the invention may be embodied in different forms and should not be construed as limited to the embodiments set forth herein. Rather, these embodiments are provided so that this disclosure will be thorough and complete, and will fully convey the scope of the invention to those skilled in the art.

In the drawings, dimensions may be exaggerated for clarity of illustration. When an element is referred to as being "between" two elements, it can be the only element between the two elements, or one or more intervening elements may also be present. Like reference numerals refer to like elements throughout.

FIGS. 3A to 6B, 7A to 7D, 8A and 8B are views illustrating step S5 shown in FIG. 2.

DETAILED DESCRIPTION

Hereinafter, exemplary embodiments of the present invention will be described with reference to the accompanying drawings in detail. However, the present invention is not limited to the embodiments disclosed below and may be implemented in various forms. Rather, the embodiments are provided to fully disclose the present invention. The scope of the invention is to be understood through the claims.

Figure 1A:
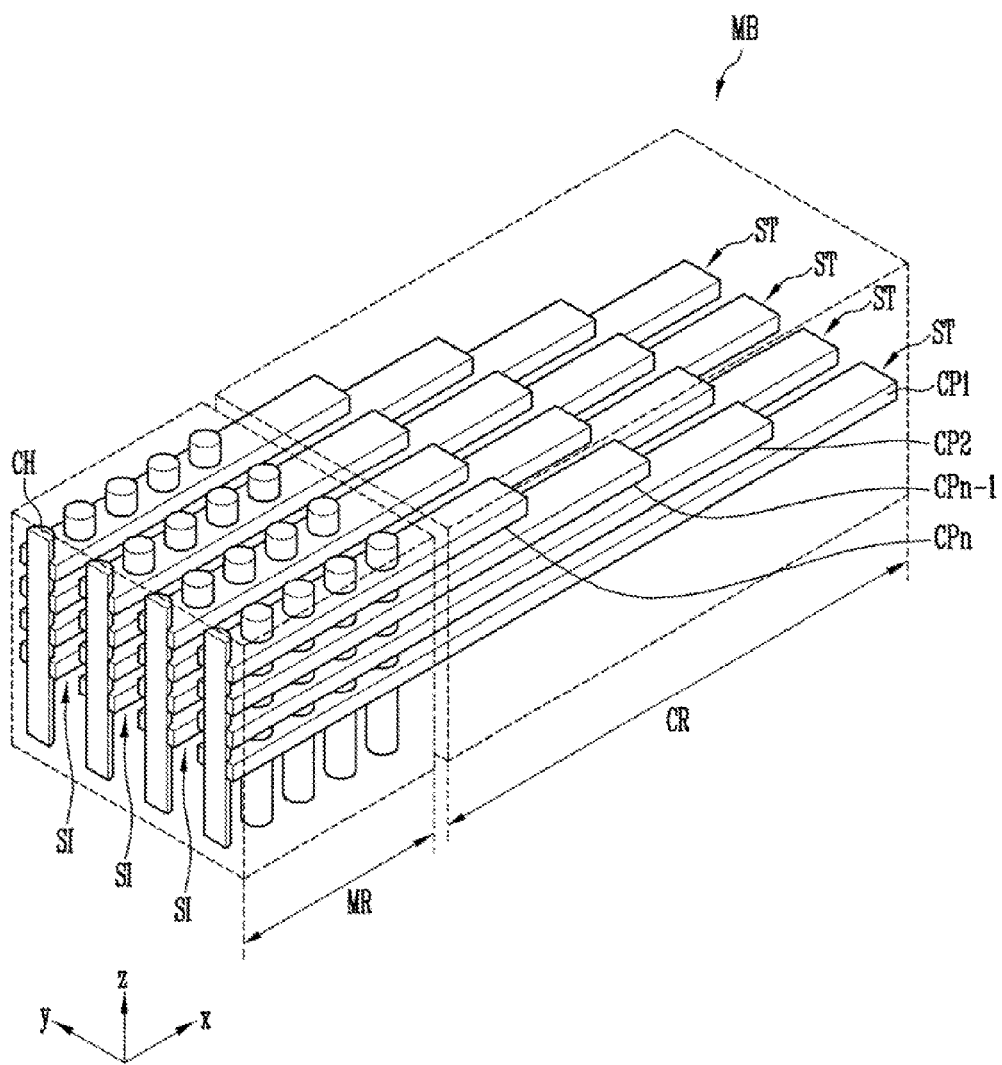
FIGS. 1A to 1C are views illustrating a memory device of a semiconductor device according to an embodiment of the present invention.
Figure 1B:
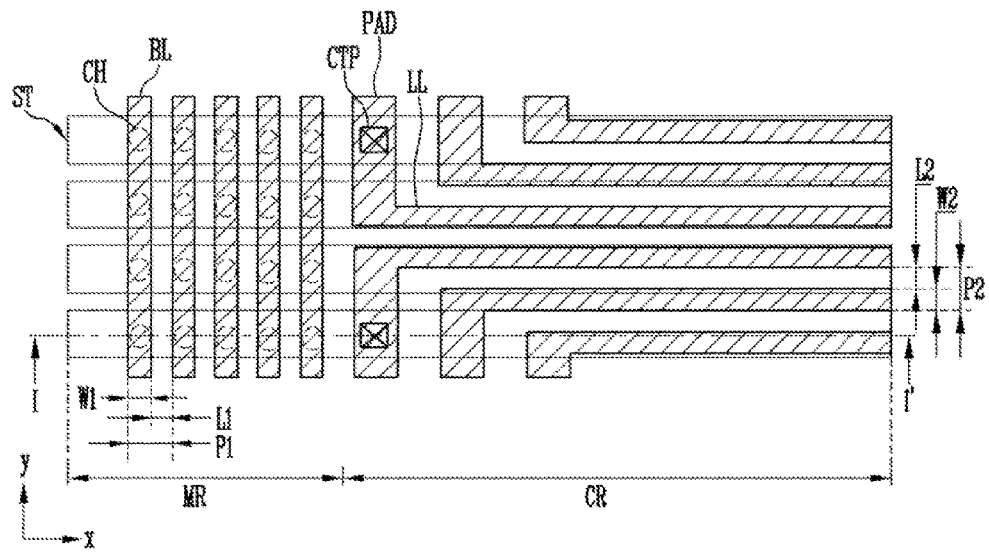
Figure 1C:
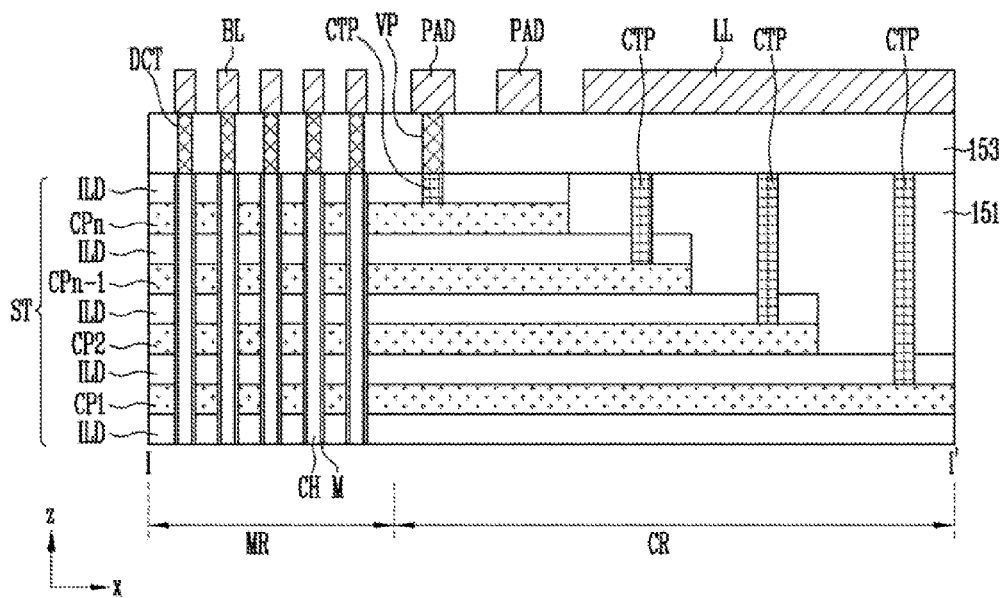

FIGS. 1A to 1C are views illustrating a memory device of a semiconductor device according to an embodiment of the present invention. More specifically, FIG. 1A is a perspective view of the memory device according to an embodiment of the present invention. FIG. 1B is a plan view of bit lines and connecting lines of the memory device according to an embodiment of the present invention. FIG. 1C is a cross-sectional view taken along a dotted line "I-I'" shown in FIG. 1B.

Referring to FIG. 1A, the memory device includes stepped stack structures ST separated from one another by slits SI. The stepped stack structures ST may be arranged along a first direction (y direction) while being spaced apart from one another. The stepped stack structures ST may be grouped to constitute a memory block MB. Each of the stepped stack structures ST includes first to nth (here, n is a natural number) layers of conductive patterns CP1 to CPn sequentially stacked. The stepped stack structures ST surround channel layers CH. The stepped stack structures ST include a memory array area MR surrounding the channel layers CH and a contact area CR extending from the memory array area MR to be patterned in the shape of steps.

Each of the conductive patterns CP1 to CPn surrounds the channel layers CH in the memory array area MR, and is patterned in the shape of a step in the contact area CR. The conductive patterns CP1 to CPn may extend along a second direction (x direction) intersecting the first direction (y direction). The conductive patterns CP1 to CPn may extend longer in the contact area CR as they are closer to a lower portion of the semiconductor device, at which a lower structure (not shown) such as a substrate is disposed. Accordingly, the conductive patterns CP1 to CPn form the shape of steps, and ends of the conductive patterns CP1 to CPn may be exposed through a stepped structure. The number of the stacked conductive patterns CP1 to CPn may be changed depending on the number of memory cells and select transistors to be stacked.

The conductive patterns CP1 to CPn may be used as word lines connected to memory cells, or may be used as select lines connected to select transistors. The uses of the conductive patterns CP1 to CPn may be changed depending on the positions of the conductive patterns CP1 to CPn. The uses of the conductive patterns CP1 to CPn depending on the positions of the conductive patterns CP1 to CPn will be described later with reference to FIGS. 9 and 10.

Each of the channel layers CH extends along a stacking direction (z direction) of the conductive patterns CP1 to CPn. The channel layers CH may be arranged in one or more straight and zigzag columns and penetrate the stack structures ST in the memory array area MR.

An upper structure including bit lines and the like may be formed above the stack structures ST and connected to first ends of the channel layers CH. The upper structure will be described with reference to FIG. 1B. The lower structure may be disposed under the stack structures ST and connected to second ends of the channel layers CH. The lower structure will be described later with reference to FIGS. 9 and 10.

Referring to FIG. 1B, bit lines BL may be connected to the first ends of the channel layers CH. The bit lines BL may extend along the first direction (y direction) intersecting the stepped stack structures ST. The bit lines BL may be arranged with a first pitch P1 having a first width W1 and a first distance L1. The first pitch P1 may be narrower than an exposure resolution limit. Each of the bit lines BL may be connected to a plurality of channel layers CH disposed along the extending direction (y direction) thereof.

Connecting lines LL and contact pads PAD leading from the respective connecting lines LL are formed on the same level (height) as the bit lines BL. The connecting lines LL may extend along the second direction (x direction) intersecting the extending direction (y direction) of the bit lines BL. First ends of the connecting lines LL may overlap the contact area CR. Although not shown in this figure, the connecting lines LL may include second ends extending to a peripheral area (not shown) from the contact area CR, to be connected to switching devices disposed in the peripheral area. The connecting lines LL may be arranged with a second pitch P2 having a second width W2 and a second distance L2. The second pitch P2 may be narrower than the exposure resolution limit. The connecting lines may be grouped in units of memory blocks and each memory block may have the symmetric structure of connecting lines. For example, connecting lines LL may extend to further protrude toward the memory array area MR as they are closer to the center of the contact area CR in one group. Accordingly, the first ends of the connecting lines LL are formed longer as they are closer to the center of the contact area CR in one group. As the first ends of the connecting lines LL closer to the center of the contact area CR are formed longer, the contact pads PAD respectively leading from the first ends of the connecting lines LL may be efficiently disposed in a limited area.

The contact pads PAD extend along the first direction (y direction) intersecting the extending direction of the connecting lines from the first ends of the connecting lines LL. The contact pads PAD may extend toward outermost stack structures among the stepped stack structures ST constituting the memory block to overlap the outermost stack structures. The contact pads PAD may be connected to contact plugs CTP connected to the conductive patterns (CP1 to CPn of FIG. 1A) of the stepped stack structures ST, respectively. Although FIG. 1B shows contact plugs CTP overlapping contact pads PAD corresponding thereto, the contact plugs CTP may not overlap the corresponding contact pads PAD. The contact plugs CTP may be coupled to the corresponding contact pads PAD through via pads. Detailed examples of the contact pads PAD, the via pads, and the contact plugs CTP will be described later with reference to FIGS. 11A to 12D.

The contact pads PAD may be formed with a width wider than the second width W2. Accordingly, it is possible to secure a contact margin between the contact pads PAD and the contact plugs CTP.

The first direction (y direction) and the second direction (x direction) may perpendicularly intersect each other. The bit lines BL and the connecting lines LL may be simultaneously formed using a spacer patterning technology (SPT). In this case, the first pitch P1 of the bit lines BL and the second pitch P2 of the connecting lines LL may be equally formed. That is, the first width W1 of each of the bit lines BL may be equal to the second width W2 of each of the connecting lines LL, and the first distance L1 between the bit lines BL may be equal to the second distance L2 between the connecting lines LL. The first and second pitches P1 and P2 may be smaller than the exposure resolution limit by the SPT.

In the present invention, the connecting lines connecting the contact plugs CTP in the contact area CR to the switching devices in the peripheral area can be formed on the same level as the bit lines BL and formed smaller than the exposure resolution limit by using the SPT. Accordingly, in the present invention, the connecting lines LL can be formed in large numbers on the level where the bit lines BL are formed. Thus, although the number of the stacked conductive patterns (CP1 to CPn of FIG. 1A) connected to the memory cells is increased to improve the integration degree of the semiconductor device, the conductive patterns (CP1 to CPn of FIG. 1A) and the switching devices in the peripheral area can be connected to each other by increasing the number of the connecting lines LL disposed on the level where the bit lines BL are formed.

In the present invention, the number of the connecting lines LL disposed on the level where the bit lines BL are formed can be increased, and thus it is unnecessary to form, over the bit lines BL, a separate line layer for connecting between the conductive patterns (CP1 to CPn of FIG. 1A) and the switching devices in the peripheral area. That is, it is unnecessary to dispose connecting lines above the bit lines BL. Thus, a space in which upper conductive patterns (not shown), other than the connecting lines, are to be disposed is secured above the bit lines BL, so that the upper conductive patterns can be formed with a sufficiently large size. Further, the resistance of the upper conductive patterns can be lowered. Accordingly, it is unnecessary to increase chip size for securing the resistance of the upper conductive patterns. As a result, the chip size can be decreased.

Referring to FIG. 1C, each of the stepped stack structures ST includes interlayer insulating patterns ILD disposed above and beneath each of the conductive patterns CP1 to CPn. That is, the conductive patterns CP1 to CPn and the interlayer insulating patterns ILD are alternately stacked to constitute the stack structures ST. The interlayer insulating patterns ILD insulate the conductive patterns CP1 to CPn.

The channel layers CH may be formed in the memory array area MR of the stepped stack structures ST by penetrating the conductive patterns CP1 to CPn and the Interlayer insulating patterns ILD, which are alternately stacked. Each of the channel layers CH is disposed inside a channel hole penetrating the stepped stack structure ST. Each of the channel layers CH may be formed as a tubular semiconductor layer along the sidewall of the channel hole while surrounding a core insulating layer filled in a central area of the channel hole. Alternatively, each of the channel layers CH may be formed as a cylindrical semiconductor layer filled from the sidewall of the channel hole to the central area of the channel hole. Alternatively, each of the channel layers CH may be formed in a structure in which the tubular semiconductor layer and the cylindrical semiconductor layer are combined together.

Each of the channel layers CH may be surrounded by a memory layer M. The memory layer M may be formed along the entire outer wall of each of the channel layers CH. Alternatively, the memory layer M may be disposed in interfaces between the channel layers CH and the conductive patterns CP1 to CPn. In this case, the memory layer M may extend along interfaces between the conductive patterns CP1 to CPn and the interlayer insulating patterns ILD. The memory layer M may include a tunnel insulating layer in contact with the channel layer CH, a data storage layer surrounding the tunnel insulating layer, and a blocking insulating layer surrounding the data storage layer. The tunnel insulating layer may be formed of an insulating material through which charges can tunnel. For example, the tunnel insulating layer may be formed as a silicon oxide layer. The data storage layer may be formed as a material layer in which charges can be trapped. For example, the data storage layer may include a silicon nitride layer, a phase change material, a nanodot, or the like. The blocking insulating layer may be formed of an Insulating material by which charges can be blocked. For example, the blocking insulating layer may include one or more of a silicon oxide layer and a high dielectric layer having a higher dielectric constant than the silicon oxide layer.

The contact area CR of the stepped stack structures ST may be covered with a planarization insulating layer 151 having a flat upper surface. The contact plugs CTP connected to the conductive patterns CP1 to CPn on their ends to extend along the extending direction (z direction) of the channel layers CH are buried inside the planarization insulating layer 151. That is, the contact plugs CTP penetrate the planarization insulating layer 151. The contact plugs CTP further penetrate the interlayer insulating patterns ILD.

An upper insulating layer 153 may be formed on the planarization insulating layer 151 including the contact plugs CTP and the stepped stack structures ST. Drain contact plugs DCT connected to the first ends of the channel layers CH and via pads VP connected to the contact plugs CTP may be buried in the upper insulating layer 153. That is, the drain contact plugs DCT and the via pads VP may be formed by penetrating the upper insulating layer 153. In this figure, only one via pad VP vertically connected on one of the contact plugs CTP is illustrated. However, the via pads VP may be disposed on the respective contact plugs CTP. An example of the detailed structure of the via pads VP will be described later with reference to FIGS. 11A to 12D.

The bit lines BL, the connecting lines LL, and the contact pads PAD are formed on the upper insulating layer 153. The bit lines BL may be connected to the drain contact plugs DCT thereon. The contact pads PAD may be connected to the contact plugs CTP via the via pads VP. The connecting lines LL may be connected to the conductive patterns CP1 to CPn via the contact pads PAD and the contact plugs CTP.

Figure 2:
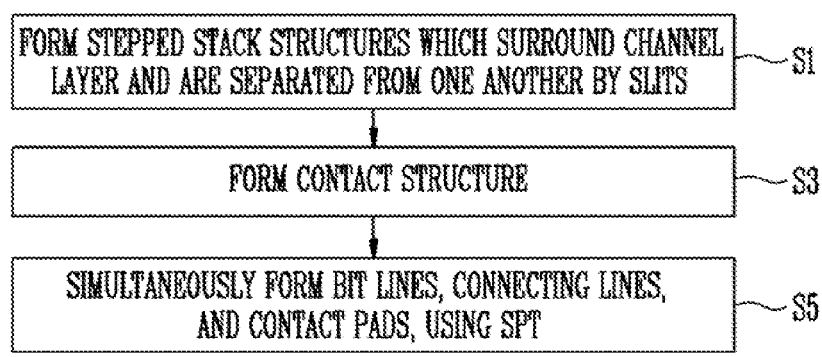
FIG. 2 is a flowchart schematically illustrating a method of manufacturing a memory device according to an embodiment of the present invention.

FIG. 2 is a flowchart schematically illustrating a method of manufacturing a memory device according to an embodiment of the present invention.

Referring to FIG. 2, in step S1, stepped stack structures are formed, which surround channel layers and are separated from one another by slits. After that, in step S3, a contact structure is formed, which includes contact plugs and via pads. Subsequently, in step S5, bit lines, connecting lines, and contact pads are simultaneously formed using the SPT.

As described above, in the embodiment of the present invention, the bit lines, the connecting lines, and the contact pads are simultaneously formed using the SPT, so that it is unnecessary to perform any separate mask process for forming the connecting lines, thereby simplifying the manufacturing process of the memory device.

Figure 3A:
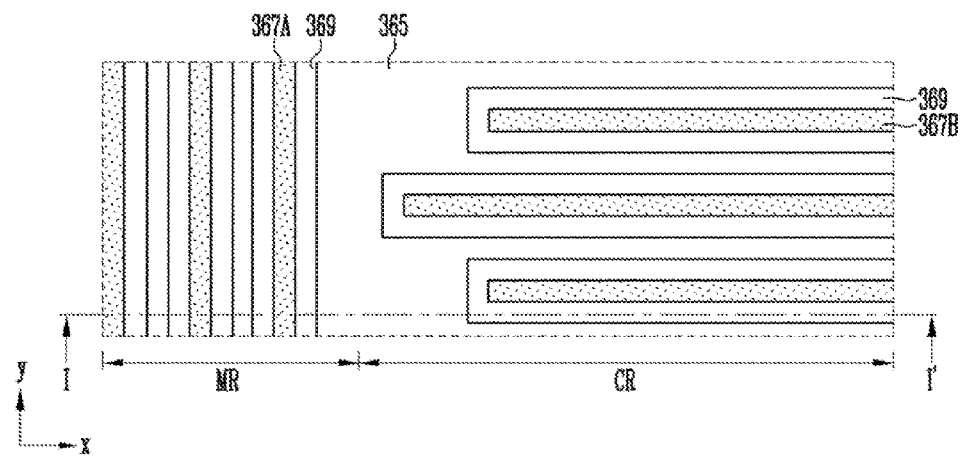

FIGS. 3A to 88B are views illustrating step S5 shown in FIG. 2.

Before describing step S5, steps S1 and S3 will be schematically described with reference to FIG. 3B.

Figure 3B:
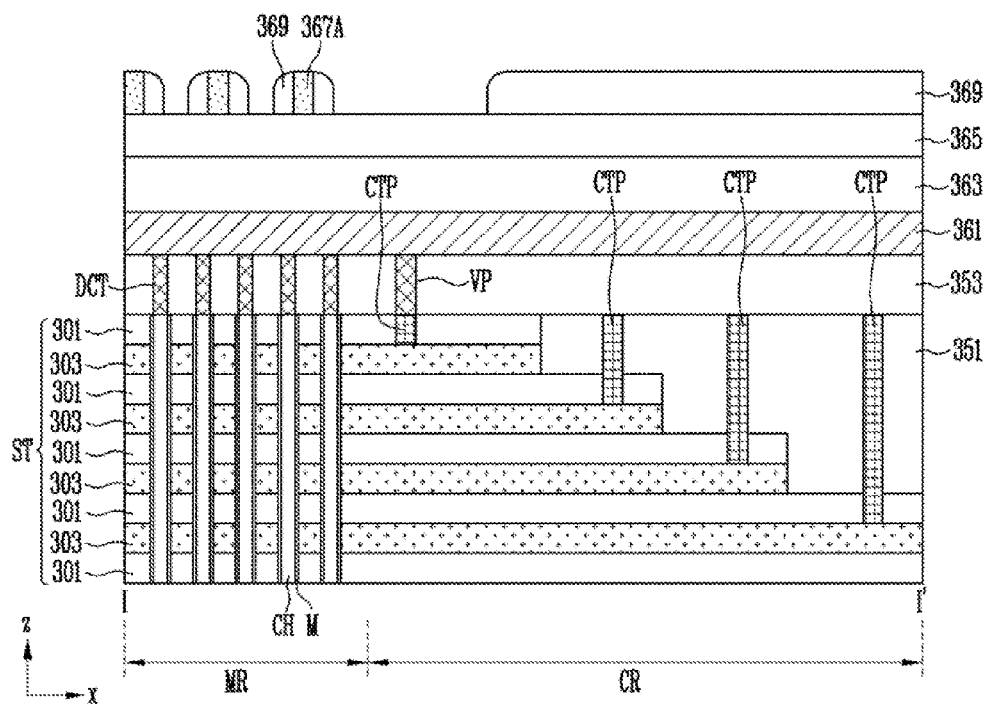

Referring to FIG. 3B, stepped stack structures ST in which a memory array area MR and a contact area CR are defined are formed on a lower structure (not shown). The stepped stack structures ST include interlayer insulating patterns 301 and conductive patterns 303, which are alternately stacked and patterned in the shape of steps. The interlayer insulating patterns 301 and the conductive patterns 303 are alternately stacked. The interlayer insulating patterns 301 and the conductive patterns 303 surround channel layers CH. The conductive patterns 303 are stacked to be spaced apart from one another while forming the shape of steps such that the respective ends of the conductive patterns 303 are exposed. An area in which the ends of the conductive patterns 303 forming the shape of steps are disposed is defined as the contact area CR, and an area in which the channel layers CH are disposed is defined as the memory array area MR. The stepped stack structures ST may be separated from one another by slits (SI of FIG. 1A).

Hereinafter, an example of the process of forming the stepped stack structures ST in which the memory array area MR and the contact area CR are defined will be described in detail.

First and second material layers are alternately stacked layer by layer on a substrate (not shown) including the lower structure. The lower structure may include a source area. The source area may be formed by implanting impurities into the substrate, or may be formed by forming a doped polysilicon layer on the substrate and then patterning the doped polysilicon layer.

The first and second material layers are formed of different materials. More specifically, the second material layers may be formed of a material having an etching selectivity with respect to the first material layers. For example, the first material layers may be formed of an insulating material for interlayer insulating patterns, and the second material layers may be formed of a conductive material for conductive patterns. Alternatively, the first material layers may be formed of an insulating material for interlayer insulating patterns, and the second material layers may be formed of an insulating material for sacrificial layers. A silicon oxide layer may be used as the insulating material for interlayer insulating patterns, and a silicon nitride layer may be used as the insulating material for sacrificial layers. Alternatively, the first material layers may be formed of a conductive material for sacrificial layers, and the second material layers may be formed of a conductive material for conductive patterns. An undoped polysilicon may be used as the conductive material for sacrificial layers, and a doped polysilicon may be used as the conductive material for conductive patterns.

Subsequently, channel holes penetrating the first and second material layers are formed, and channel layers CH are formed inside the channel holes. Before the channel layers CH are formed, a memory layer M may be formed along sidewalls of the channel holes. After that, the first and second material layers may be patterned in the shape of steps.

Subsequently, slits (SI of FIG. 1A) may be formed, which separate the first and second material layers patterned in a stepped structure into a plurality of stack structures.

When the first material layers are formed of an insulating material for interlayer insulating patterns and the second material layers are formed of a conductive material for conductive patterns, a subsequent process of forming a planarization insulating layer 351 may be performed to cover the contact area CR of the stepped stack structures ST including the interlayer insulating patterns 301 and the conductive patterns 303.

When the first material layers are formed of an insulating material for interlayer insulating patterns and the second material layers are formed of an insulating material for sacrificial layers, the second material layers are selectively removed through the slits. After that, the conductive patterns 303 are filled in the area from which the second material layers are removed. Although not shown in this figure, before the conductive patterns 303 are filled, the memory layer M may be formed along the surface of the area from which the second material layers are removed. After the conductive patterns 303 are formed, a subsequent process of forming the planarization insulating layer 351 may be performed.

When the first material layers are formed of a conductive material for sacrificial layers and the second material layers are formed of a conductive material for conductive patterns, the first material layers are selectively removed through the slits. After that, the interlayer insulating patterns 301 is filled in the area from which the first material layers are removed. After the interlayer insulating patterns 301 are formed, a subsequent process of forming the planarization insulating layer 351 may be performed.

Subsequently, contact plugs CTP connected to the ends of the conductive patterns 303 disposed in the contact area CR by penetrating the planarization insulating layer 351 and the interlayer insulating patterns 301 are formed. The contact plugs CTP extend along the extending direction of the channel layers CH, and are formed in different depths toward the top surfaces of the conductive patterns 303 respectively corresponding to the contact plugs CTP from the top surface of the planarization insulating layer 351.

After that, an upper insulating layer 353 may be formed on the planarization insulating layer 351 and the stepped stack structures ST. Subsequently, drain contact plugs DCT and via pads VP, which penetrate the upper insulating layer 353, may be formed. The drain contact plugs DCT are connected to the channel layers CH. The via pads VP are connected to the contact plugs CTP on the contact area CR of the stepped stack structures ST. A detailed relationship between the via pads VP and the contact plugs CTP will be described later with reference to FIGS. 11A to 12D.

Subsequently, step S5 is performed. Since step S5 is performed using the SPT, pitches of patterns formed in step S5 may be smaller than the exposure resolution limit. An exposure device applied to the SPT in step S5 does not use dipole illumination but uses annular illumination or quadrupole illumination. Accordingly, patterns perpendicularly intersecting each other can be simultaneously formed using the SPT.

Hereinafter, step S5 will be described in detail.

Referring to FIGS. 3A and 3B, a conductive layer 361 as a layer to be etched is formed on the upper insulating layer 353. After that, a first mask layer 363 and a second mask layer 365 are sequentially stacked on the conductive layer 361. The first mask layer 363 may be formed of a material having an etching selectivity with respect to the conductive layer 361. The second mask layer 365 may be formed of a material having an etching selectivity with respect to the first mask layer 363.

Subsequently, first sacrificial patterns 367A and second sacrificial patterns 367B are formed on the second mask layer 365. The first sacrificial patterns 367A extend along the first direction (y direction), and are disposed on the memory array area MR of the stepped stack structures ST. The second sacrificial patterns 367B extend along the second direction (x direction) intersecting the first direction, and are disposed on the contact area CR of the stepped stack structures ST. The first direction (y direction) and the second direction (x direction) may perpendicularly intersect each other. The first and second sacrificial patterns 367A and 367B may be patterned through an etching process using, as etch barriers, photoresist patterns (not shown) formed using the exposure device. Accordingly, before the first and second sacrificial patterns 367A and 367B are formed, the photoresist patterns are formed using the exposure device. The photoresist patterns may be divided into first photoresist patterns defining an area in which the first sacrificial patterns 367A are formed, and second photoresist patterns defining an area in which the second sacrificial patterns 367B are formed. The first and second photoresist patterns may extend along directions perpendicularly intersecting each other. In order to stably implement the first and second photoresist patterns extending along the directions perpendicularly intersecting each other, the present invention uses an exposure device including annular illumination or quadrupole illumination.

After the first and second sacrificial patterns 367A and 367B are patterned using the first and second photoresist patterns described above, the first and second photoresist patterns may be removed.

Subsequently, a spacer layer 369 surrounds the sidewall of each of the first and second sacrificial patterns 367A and 367B. The spacer layer 369 may be formed by forming an oxide layer along surfaces of the first and second sacrificial patterns 367A and 367B and etching the oxide layer through an etch back process such that the top surfaces of the first and second sacrificial patterns 367A and 367B are exposed. The oxide layer for the spacer layer 369 may be a low temperature oxide (LTO) layer to be formed along the surfaces of the first and second sacrificial patterns 367A and 367B without being completely filled in spaces between the first sacrificial patters 367A and spaces between the second sacrificial patterns 367B. The LTO layer may be deposited at a temperature ranging from 0° C. to 200° C. In addition, the material layer for the spacer layer 369 may be formed of various materials in various manners, in which the step difference can be maintained.

Figure 4A:
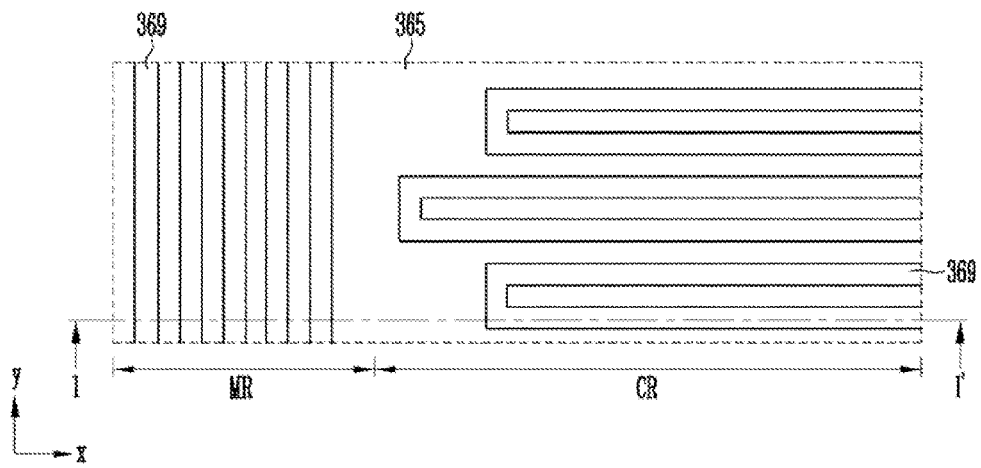
Figure 4B:
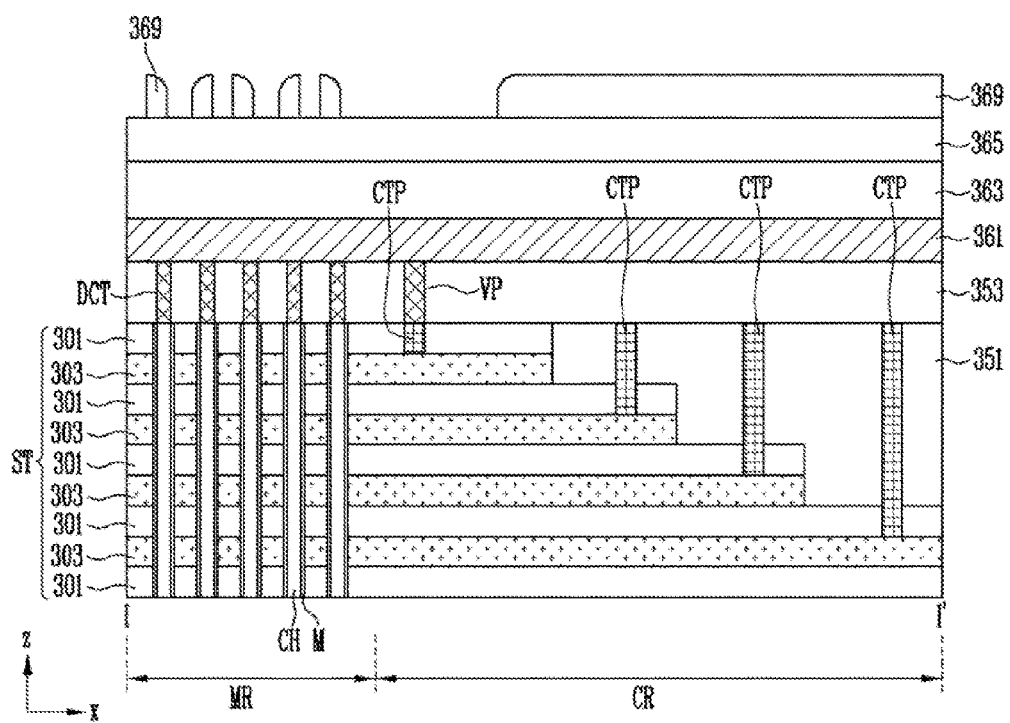

Referring to FIGS. 4A and 48, the first and second sacrificial patterns 367A and 367B are selectively removed.

Figure 5A:
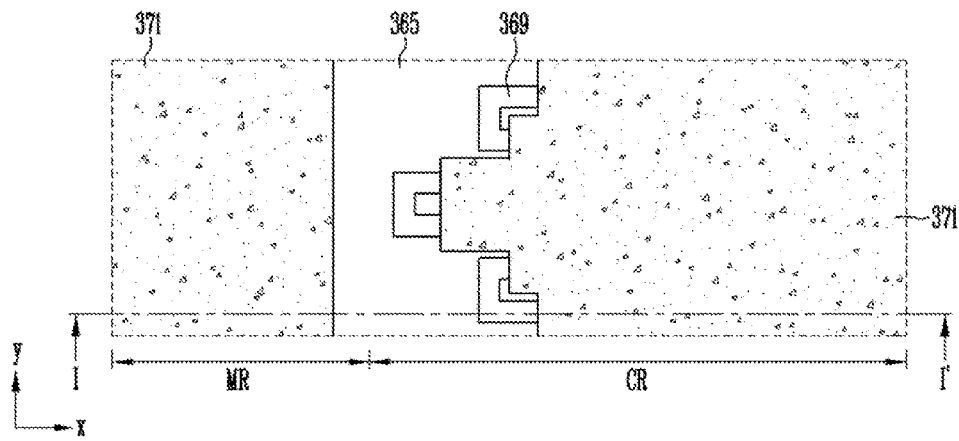
Figure 5B:
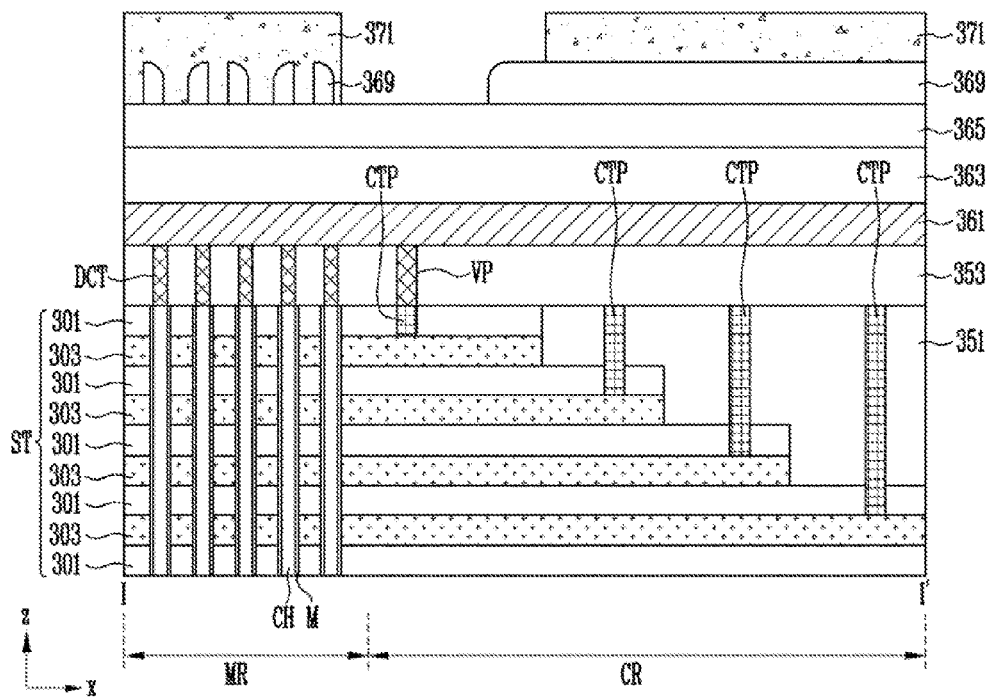

Referring to FIGS. 5A and 58, a photoresist pattern 371 exposing both end portions of the spacer layer 369 is formed.

Referring to FIGS. 6A and 68B, the spacer layer 369 is separated into first spacer patterns 369A and second spacer patterns 369B by removing both end portions of the spacer layer 369, using the photoresist pattern 371 as a mask. The first spacer patterns 369A are line patterns which are disposed on the memory cell area MR of the stepped stack structures ST, and extend along the first direction (y direction). The second spacer patterns 369B are line patterns which are disposed on the contact area CR of the stepped stack structures ST, and extend along the second direction (x direction). One end of the second spacer patterns 369B facing the memory array area MR may be formed to further protrude toward the memory array area MR as they get closer to the center of the contact area CR. Through the above-described form of the second spacer patterns 369B, pad mask patterns can be efficiently disposed on the second spacer patterns 369B in a subsequent process.

Referring to FIGS. 7A and 7B, pad mask patterns 375 are formed to overlap the one end of the second spacer patterns 369B facing the memory array area MR. The pad mask patterns 375 may be photoresist patterns formed using a photolithography process. The width of each of the pad mask patterns 375 may be wider than that of each of the second spacer patterns 369B. The pad mask patterns 375 may be connected to the one ends of the second spacer patterns 369B to extend along the first direction (y direction) intersecting the extending direction (x direction) of the second spacer patterns 369B.

Before the above-described pad mask patterns 375 are formed, a spin-on-carbon layer 371 may be further formed on the second mask layer 365 to cover the first and second spacer patterns 369A and 369B. After that, a multi function hard mask (MFHM) 373 may be formed on the spin-on-carbon layer 371.

Figure 7C:
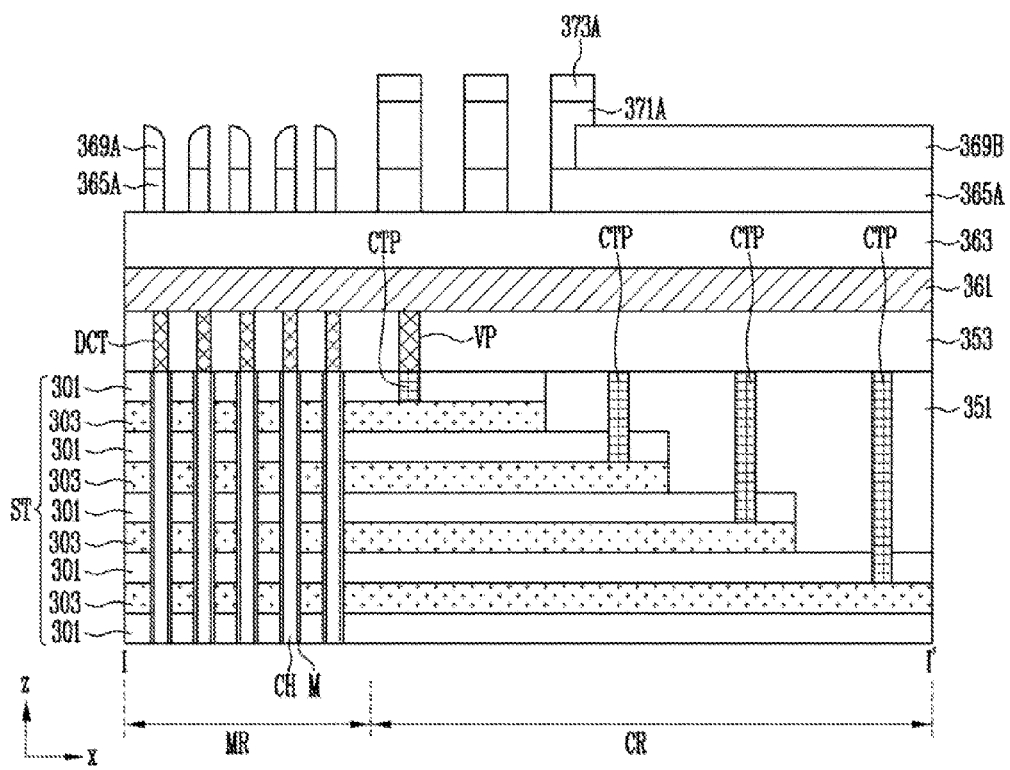

Referring to FIG. 7C, the MFHM (373 of FIG. 7B) and the spin-on-carbon layer (371 of FIG. 7B) are etched through an etching process using the pad mask patterns (375 of FIG. 7B) as etch barriers. Accordingly, HFHM patterns 373A and spin-on-carbon patterns 371A can be formed. In this process, the first and second spacer patterns 369A and 369B may be partially etched, and the pad mask patterns 375 may be removed.

After that, second mask patterns 365A are formed by etching the second mask layer (365 of FIG. 7B) through an etching process using, as etch barriers, the first and second spacer patterns 369A and 369B, the HFHM patterns 373A, and the spin-on-carbon patterns 371A.

Figure 7D:
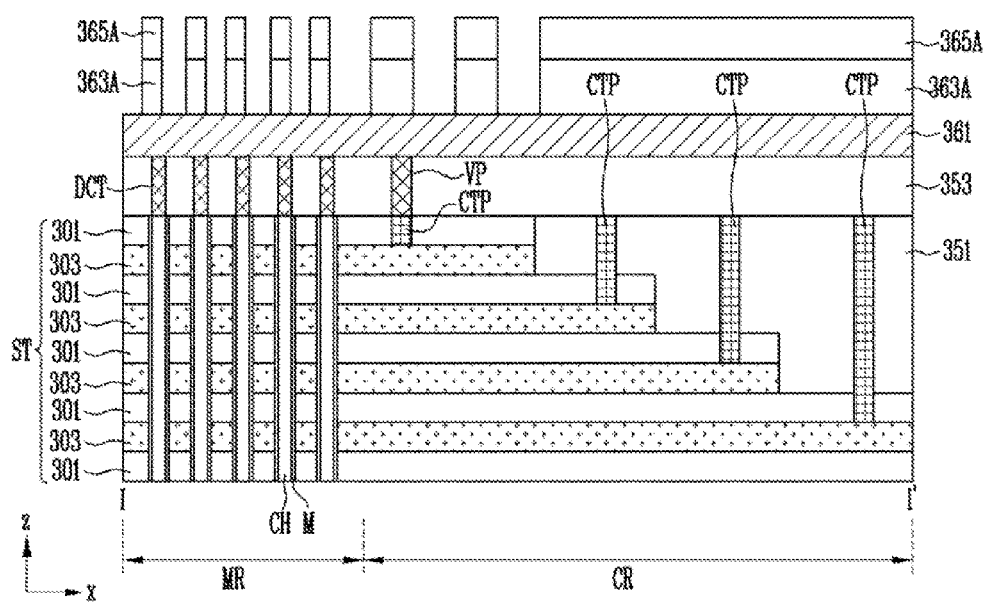

Referring to FIG. 7D, the first and second spacer patterns (369A and 369B of FIG. 7C), the HFHM patterns (373A of FIG. 7C), and the spin-on-carbon patterns (371A of FIG. 7C) are removed, and the first mask layer (363 of FIG. 7C) is etched through an etching process using the second mask patterns 365A as etch barriers. Accordingly, first mask pattern 363A are formed.

The first mask patterns 363A may include line portions corresponding to the first and second spacer patterns (369A and 369B of FIG. 7A) and pad portions corresponding to the pad mask patterns (375 of FIG. 7A).

The second mask patterns 365A may be removed after the first mask patterns 363A are formed.

Figure 8A:
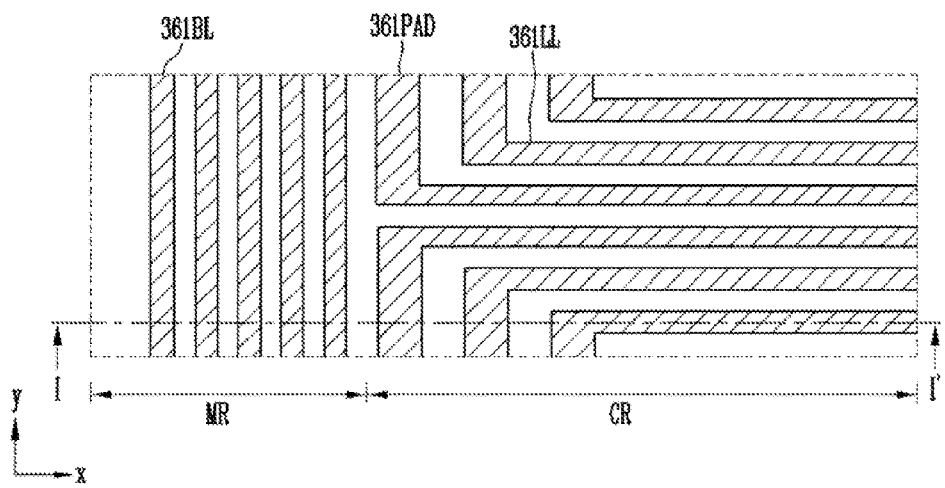
Figure 8B:
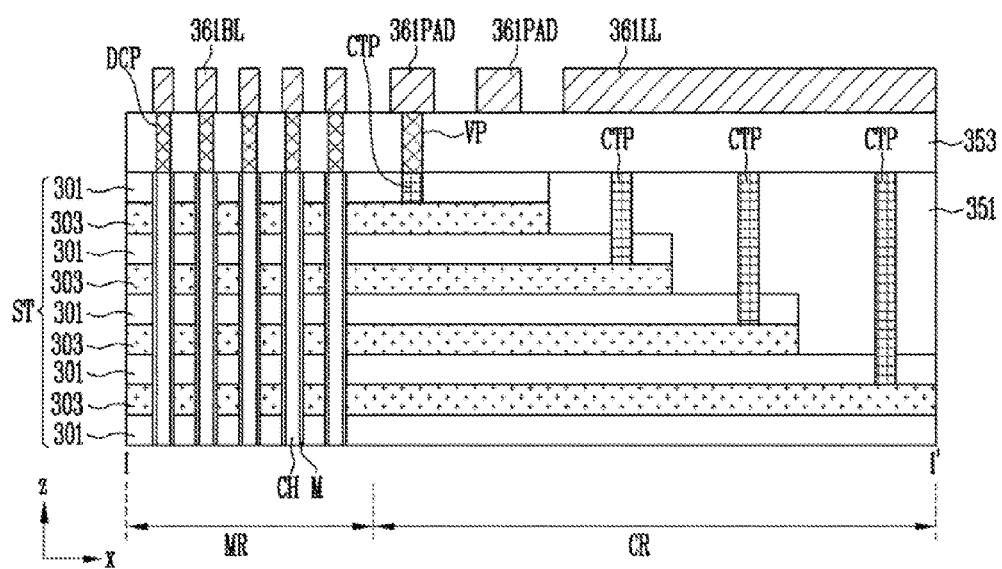

Referring to FIGS. 8A and 8B, bit lines 361BL, contact pads 361PAD, and connecting lines 361LL are formed by etching the conductive layer (361 of FIG. 7D) through an etching process using the first mask patterns (363A of FIG. 7D) as etch barriers. After that, the first mask patterns (363A of FIG. 7D) may be removed.

The bit lines 361BL are defined by the first spacer patterns (369A of FIG. 7A). The connecting lines 361LL are defined by the second space patterns (369B of FIG. 7A). The contact pads 361PAD are defined by the pad mask patterns (375 of FIG. 7A).

The layout of the bit lines 361BL, the contact pads 361PAD, and the connecting lines 361LL is the same as that described in FIG. 1B.

Figure 9:
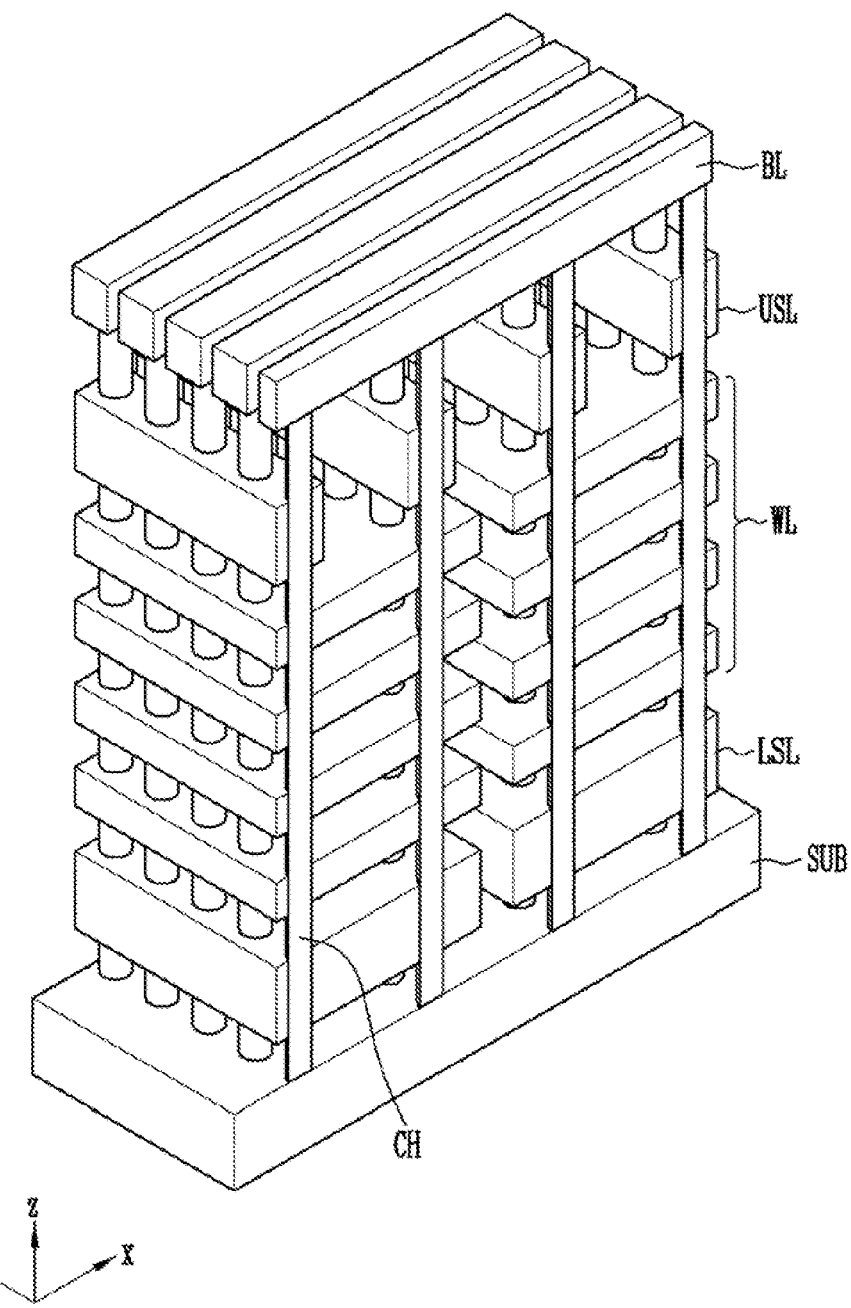
FIG. 9 is a perspective view illustrating a structure of a straight-type memory string according to an embodiment of the present invention.

FIG. 9 is a perspective view illustrating a structure of a straight-type memory string according to an embodiment of the present invention. For simplified illustration, insulating layers and memory layers are not shown in FIG. 9.

Referring to FIG. 9, the straight-type memory string may be formed along straight-type channel layers CH. The straight-type memory string may be electrically connected between a semiconductor substrate SUB including a source area and bit lines BL. Conductive patterns LSL, WL, and USL are stacked to be spaced apart from one another between the semiconductor substrate SUB and the bit lines BL. The conductive patterns LSL, WL, and USL may be separated into stack structures by slits.

The semiconductor substrate SUB including the source area may be directly connected to lower ends of the channel layers CH. The source area may be formed by implanting impurities into the semiconductor substrate SUB, or may be formed by depositing a doped silicon layer on the semiconductor substrate SUB.

The conductive patterns LSL, WL, and USL may include at least one lower select line LSL, word lines WL disposed on the lower select line LSL, and at least one upper select line USL disposed on the word lines WL. Here, the word lines WL may be formed in a plate shape, and any one of the lower and upper select lines LSL and USL may be formed in a line shape. Alternately, the word lines WL and the lower and upper select lines LSL and USL may be formed in a line shape.

The channel layers CH penetrate the conductive patterns LSL, WL, and USL. A memory layer may be formed between the channel layers CH and the conductive patterns LSL, WL, and USL. The channel layers CH are electrically connected to the bit lines BL.

According to the above-described structure, at least one lower select transistor, memory cells, and at least one upper select transistor, which are connected in series, constitute one memory string, and are arranged in a line. The structure of the memory string, shown in FIG. 9, may be formed in the memory array area MR described in FIGS. 1A to 1C, and the conductive patterns LSL, WL, and USL shown in FIG. 9 correspond to the conductive patterns CP1 to CPn described in FIGS. 1A to 1C.

The above-described memory string may be formed on the semiconductor substrate SUB including the source area by using the processes described in FIGS. 2 to 8B.

Figure 10:
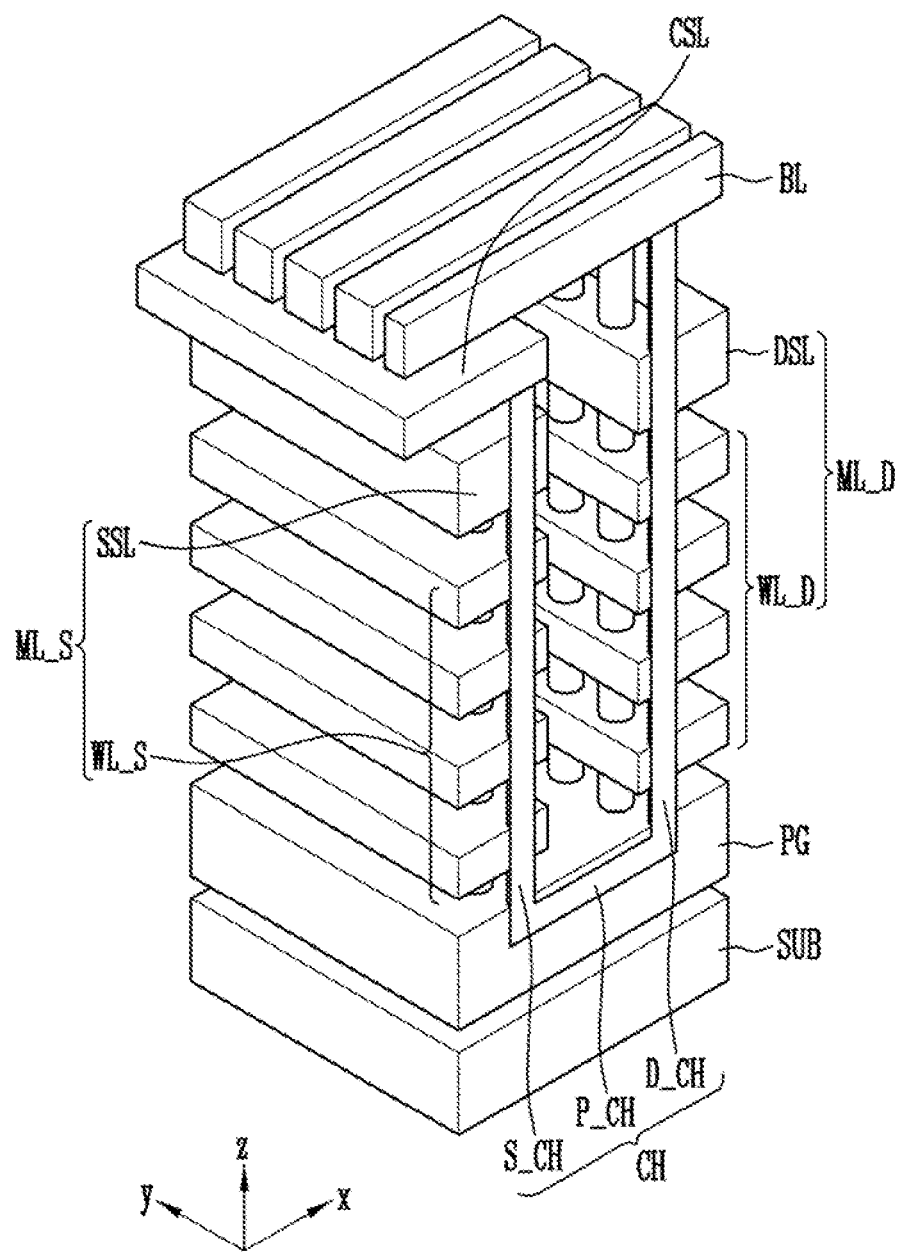
FIG. 10 is a perspective view illustrating a structure of a U-shaped memory string according to an embodiment of the present invention.

FIG. 10 is a perspective view illustrating a structure of a U-shaped memory string according to an embodiment of the present invention. For simplified illustration, no insulation layers or memory layers are shown in FIG. 10.

Referring to FIG. 10, the memory string may be disposed along a channel layer CH connected between bit lines BL and a common source line CSL. The channel layer shown in FIG. 10 is formed in a U shape, but may be formed in various shapes including a W shape and the like. The bit lines BL and the common source line CSL are spaced apart from each other in different layers. For example, the common source line CSL may be disposed under the bit lines BL. The bit lines BL and the common source line CSL are formed of a conductive material.

A pipe gate PG may be disposed below the bit lines BL and the common source line CSL. The pipe gate PG is formed of a conductive material.

Drain-side stack structures ML_D and source-side stack structures ML_S may be disposed on the pipe gate PG. The drain-side stack structures ML_D and the source-side stack structures ML_S are disposed below the bit lines BL and the common source line CSL. The drain-side stack structures ML_D and the source-side stack structures ML_S may be electrically separated from each other by slits. The drain-side stack structures ML_D and the source-side stack structures ML_S are opposite to each other with the slits interposed therebetween. The drain-side stack structures ML_D or the source-side stack structures ML_S correspond to the stepped stack structures described in FIGS. 1A to 1C.

The drain-side stack structures ML_D include drain-side conductive patterns WL_D and DSL stacked to be spaced apart from one another. The source-side stack structures ML_S include source-side conductive patterns WL_S and SSL stacked to be spaced apart from one another. The drain-side conductive patterns WL_D and DSL include at least one drain select line DSL, and drain-side word lines WL_D between the drain select line DSL and the pipe gate PG. The source-side conductive patterns WL_S and SSL include at least one source select line SSL, and source-side word lines WL_S between the source select line SSL and the pipe gate PG.

The channel layer CH may include a drain-side channel layer D_CH penetrating the drain-side stack structure ML_D, a source-side channel layer S_CH penetrating the source-side stack structure ML_S, and a pipe channel layer P_CH connecting the drain-side channel layer D_CH and the source-side channel layer S_CH by penetrating the pipe gate PG. The outer wall of the channel layer CH may be surrounded by a memory layer (not shown). The drain-side channel layer D_CH may be electrically connected to the bit lines BL. The source-side channel layer S_CH may be electrically connected to the common source line CSL.

According to the above-described structure, at least one drain select transistor, drain-side memory cells, a pipe transistor, source-side memory cells, and at least one source select transistor, which are connected in series, constitute one memory string, and are arranged in a U shape. The structure of the memory string shown in FIG. 10 may be formed in the memory array area MR described in FIGS. 1A to 1C, and the drain-side conductive patterns WL_D and DSL or the source-side conductive patterns WL_S and SSL shown in FIG. 10 correspond to the conductive patterns CP1 to CPn described in FIGS. 1A to 1C.

The above-described memory string may be formed using the processes described in FIGS. 2 to 8B. However, in order to form the memory string shown in FIG. 10, before stepped stack structures are formed, the pipe gate PG including a pipe hole filled with a sacrificial layer is first formed, and the processes described in FIGS. 2 to 8B are performed on the pipe gate PG. The sacrificial layer filling the pipe hole is removed in the process of forming the channel layer CH, and the pipe hole is then filled with the pipe channel layer P_CH. In order to form the memory string shown in FIG. 10, a step of forming the common source line CSL may be further performed, before a spacer patterning process is performed.

Hereinafter, an example of upper structures (a via pad, a contact plug, a common source line, a bit line, a connecting line, a contact pad, and the like) connected to the memory string shown in FIG. 10 will be described with reference to FIGS. 11A to 11C, and an example of a method of manufacturing the upper structures will be described with reference to FIGS. 12A to 12D.

Figure 11A:
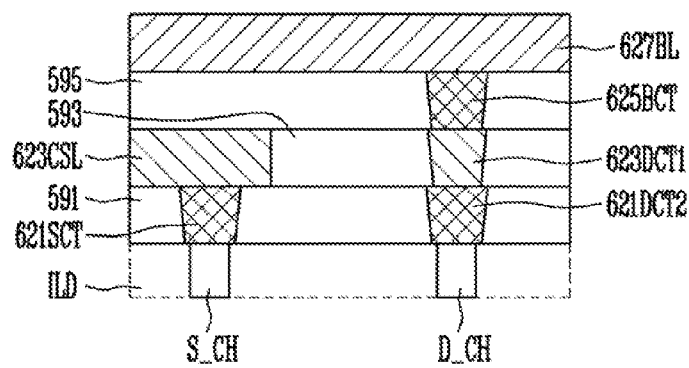
FIGS. 11A to 11C are cross-sectional views illustrating structures formed over a channel layer and a contact plug of the memory string shown in FIG. 10.
Figure 11B:
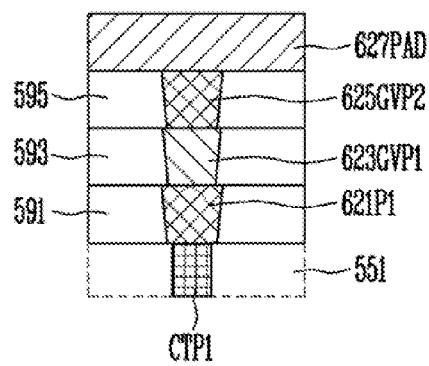
Figure 11C:
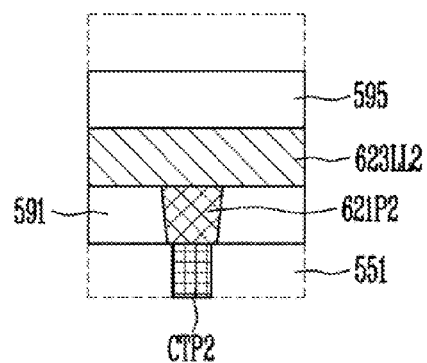

FIGS. 11A to 11C are cross-sectional views illustrating structures formed over a channel layer and a contact plug of the memory string shown in FIG. 10. Particularly, FIG. 11A illustrates a memory array area of the memory string, and FIGS. 11B and 11C illustrate a contact area of the memory string, in accordance with the embodiment of the present invention.

Referring to FIG. 11A, a first upper insulating layer 593 may be formed on an uppermost layer pattern (e.g., an interlayer insulating pattern ILD) of the stack structure which the source-side channel layer S_CH and the drain-side channel layer D_CH penetrate. A common source line 623CSL connected to the source-side channel layer S_CH and a first drain contact plug 623DCT1 connected to the drain-side channel layer D_CH may be buried inside the first upper insulating layer 593.

A second upper insulating layer 595 may be formed on the first upper insulating layer 539. A bit line contact plug 625BCT connected to the first drain contact plug 623DCT1 may be buried inside the second upper insulating layer 595.

A bit line 627BL connected to the bit line contact plug 625BCT may be formed on the second upper insulating layer 595.

A third upper insulating layer 591 may be further formed under the first upper insulating layer 593. A source contact plug 621SCT connected between the source-side channel layer S_CH and the common source line 623CSL and a second drain contact plug 621DCT2 connected between the drain-side channel layer D_CH and the first drain contact plug 623DCT1 may be buried inside the third upper insulating layer 591.

According to the above-described structure, the first drain contact plug 623DCT1 and the bit line contact plug 625BCT may be disposed between the bit line 627BL and the drain-side channel layer D_CH, and the second drain contact plug 621DCT2 may be further disposed between the first drain contact plug 623DCT1 and the drain-side channel layer D_CH. Accordingly, the bit line 627BL can be electrically connected to the drain-side channel layer D_CH via the first and second drain contact plugs 623DCT1 and 621DCT2 and the bit line contact plug 625BCT.

Referring to FIGS. 11B and 11C, the first to third upper insulating layers 593, 595, and 591 may extend to the contact area (CR of FIGS. 1A to 1C). The first to third upper insulating layers 593, 595, and 591 may be formed on a planarization insulating layer 551 in the contact area. Contact plugs CTP1 and CTP2 connected to ends of the conductive patterns, as described in FIG. 1C, are buried in the planarization insulating layer 551. For simplified illustration, the contact plugs CTP1 and CTP2 are divided into first contact plugs CTP1 and second contact plugs CTP2. The first contact plugs CTP1 are defined as being connected to the upper conductive patterns disposed adjacent to the common source line among the conductive patterns of the drain-side and source side stack structures shown in FIG. 10, and the second contact plugs CTP2 are defined as being connected to the lower conductive patterns disposed between the pipe gate and the upper conductive patterns shown in FIG. 10.

When the third upper insulating layer 591 is formed in the contact area, first plug pads 621P1 connected to the first contact plugs CTP1 and second plug pads 621P2 connected to the second contact plugs CTP2 may be buried inside the third upper insulating layer 591. The first and second plug pads 621P1 and 621P2 may be formed larger than the first and second contact plugs CTP1 and CTP2 to secure contact margins. The first and second plug pads 621P1 and 621P2 may be formed on the same level as the second drain contact plug 621DCT2 and the source contact plug 621SCT.

Via pads 623GVP1 of a first group, connected to the first contact plugs CTP1, may be buried inside the first upper insulating layer 593 in the contact area. The via pads 623GVP1 of the first group may be connected to the first contact plugs CTP1 via the first plug pads 621P1. Via pads 625GVP2 of a second group, connected to the via pads 623GVP1, may be buried inside the second upper insulating layer 595 in the contact area. Contact pads 627PAD leading from first connecting lines (627LL1 of FIG. 12D) may be connected to the via pads 625GVP2 of the second group.

Second connecting lines 623LL2 connected to the second contact plugs CTP2 may be buried inside the first upper insulating layer 593 in the contact area. The second connecting lines 623LL2 may be connected to the second contact plugs CTP2 via the second plug pads 621P2. The second upper insulating layer 595 may be disposed over the second connecting lines 623LL2.

In the above, the via pads 623GVP1 of the first group and the second connecting lines 623LL2 may be formed on the same level as the common source line 623CSL. The via pads 625GVP2 of the second group may be formed on the same level as the bit line contact plug 625BCT. The contact pads 627PAD and the first connecting lines (627LL1 of FIG. 12D) may be formed on the same level as the bit line 627BL. The first connecting lines and the second connecting lines 623LL2 may be connected to switching devices extending to a peripheral area, the switching devices being disposed in the peripheral area. The first connecting lines may be disposed on the same level as the bit lines 627BL, formed smaller than the exposure resolution limit, and simultaneously formed with the bit lines 627BL by using the SPT.

FIGS. 12A to 12D are plan views illustrating the structures shown in FIGS. 11A to 11C and a manufacturing method thereof. FIGS. 12A to 12D illustrate a contact area of stepped stack structures constituting one memory block. For simplified illustration, any insulating layer is not shown in FIGS. 12A to 12D.

Figure 12A:
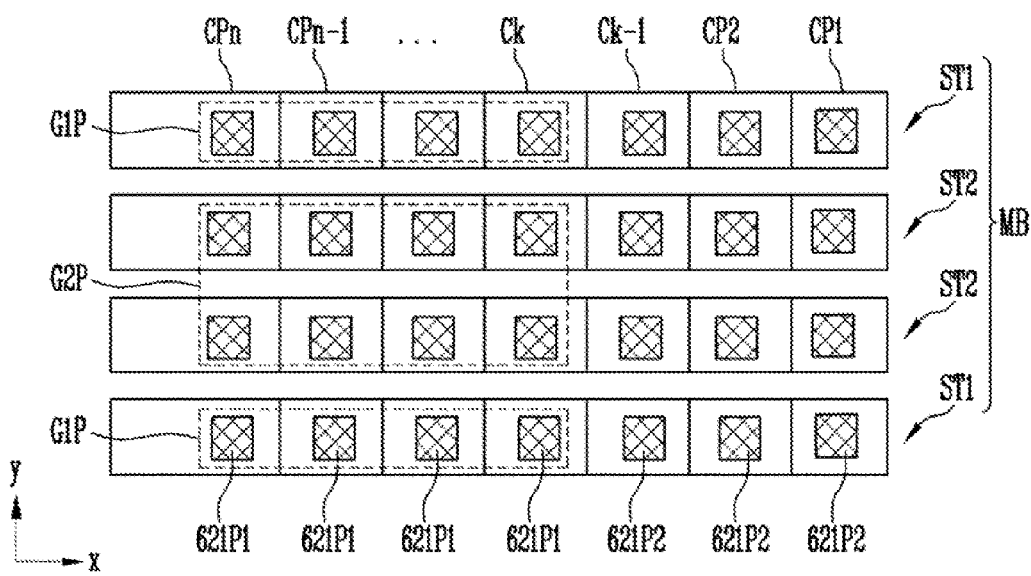
FIGS. 12A to 12D are plan views illustrating the structures shown in FIGS. 11A to 11C and a manufacturing method thereof.

Referring to FIG. 12A, stepped stack structures ST1 and ST2 constituting a memory block MB may be separated from one another by slits, and arranged along the first direction (y direction). The stepped stack structures ST1 and ST2 may be drain-side stack structures or source-side stack structures shown in FIG. 10. Each of the stepped stack structures ST1 and ST2 includes first to nth (here, n is a natural number) conductive patterns CP1 to CPn sequentially stacked while forming the shape of steps such that their ends are exposed. The conductive patterns CP1 to CPn may extend to a memory array area along the second direction (x direction) intersecting the first direction (y direction). The structure of the memory array area refers to FIG. 10.

The stepped stack structures ST1 and ST2 include first stepped stack structures ST1 disposed at outermost portions of the memory block MB, and second stepped stack structures ST2 disposed between the first stepped stack structures ST1. The first contact plugs (CPT1 of FIG. 11B) and the first plug pads 621P1 may be connected to ends of kth to nth (here, k is a natural number smaller than n) upper conductive patterns CPk to CPn among the conductive patterns CP1 to CPn of each of the first and second stepped stack structures ST1 and ST2. The first contact plugs may overlap the first plug pads 621P1 under the first plug pads 621P1. The second contact plugs (CPT2 of FIG. 11C) and the second plug pads 621P2 may be connected to ends of first to (k−1)th lower conductive patterns CP1 to CPk−1 among the conductive patterns CP1 to CPn of each of the first and second stepped stack structures ST1 and ST2. The second contact plugs may overlap the second plug pads 621P2 under the second plug pads 621P2.

In the above, the first contact plugs and the first plug pads 621P1 include plugs G1P of a first group and plugs G2P of a second group. The plugs G1P of the first group include first contact plugs and first plug pads 621P1, connected to the ends of the kth to nth upper conductive patterns CPk to CPn of the first stepped stack structures ST1. The plugs G2P of the second group include first contact plugs and first plug pads 621P1, connected to the ends of the kth to nth upper conductive patterns CPk to CPn of the second stepped stack structures ST2.

Referring to FIGS. 11A, 11B, 11C, and 12A, the first and second contact plugs CTP1 and CTP2 may be formed after the stepped stack structures ST1 and ST2 separated from one another by the slits are formed, and the planarization insulating layer 551 is formed. Each of the stepped stack structures ST1 and ST2 may include a source-side stack structure (ML_S of FIG. 10) and a drain-side stack structure (ML_D of FIG. 10). The source-side stack structure may surround a source-side channel layer S_CH and extend from the memory array area to the contact area. The drain-side stack structure may surround a drain-side channel layer D_CH and extend from the memory array area to the contact area. The planarization insulating layer 551 may be formed to cover the stepped stack structures ST1 and ST2 in the contact area.

The first and second contact plugs CTP1 and CTP2 may extend along the stacking direction (z direction) of the conductive patterns CP1 to CPn to be connected to the ends of the conductive patterns CP1 to CPn by penetrating the planarization insulating layer 551.

The first and second plug pads 621P1 and 621P2 may be formed to penetrate the third upper insulating layer 591 after the third insulating layer 591 is formed on the planarization insulating layer 551. The source contact plug 621SCT and the second drain contact plug 621DCT2, which penetrate the third upper insulating layer 591, may be simultaneously formed with the first and second plug pads 621P1 and 621P2.

Figure 12B:
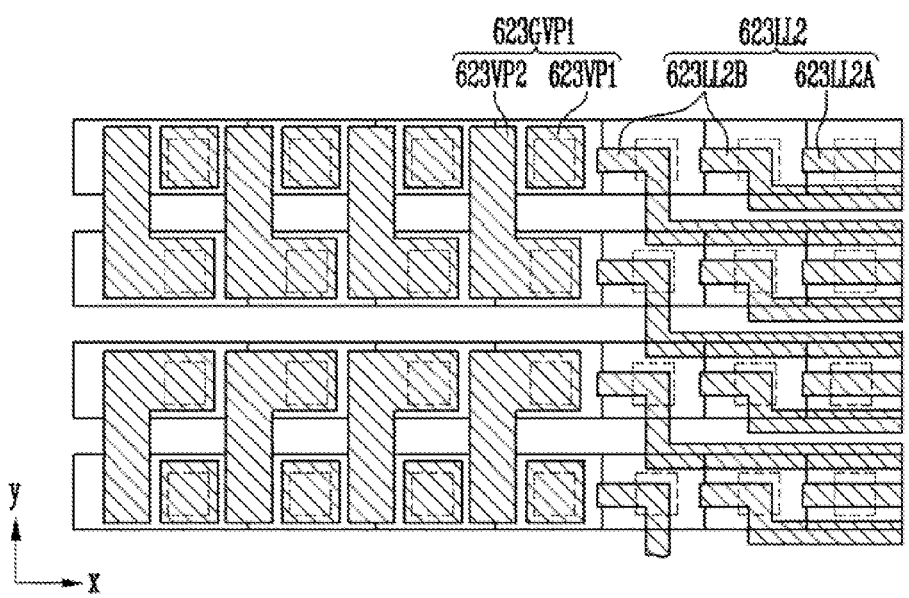

Referring to FIG. 12B, the via pads 623GVP1 of the first group may be formed on and connected to the plugs (G1P of FIG. 12A) of the first group and the plugs (G2P of FIG. 12A) of the second group, and the second connecting lines 623LL2 may be formed on and connected to the second plug pads (621P2 of FIG. 12A). When the first and second plug pads (621P1 and 621P2 of FIG. 12A) are not formed, the via pads 623GVP1 of the first group may be directly connected with the first contact plugs (CTP1 of FIG. 11B) without passing through the first plug pads (621P1 of FIG. 12A). The second connecting lines 623LL2 may be directly connected with the second contact plugs (CTP2 of FIG. 11C).

The via pads 623GVP1 of the first group may include first via pads 623VP1 and second via pads 623VP2. The first via pads 623VP1 are connected to the plugs (G1P of FIG. 12A) of the first group, connected to the ends of the kth to nth conductive patterns (CPK to CPn of FIG. 12A) of the first stepped stack structures (ST1 of FIG. 12A). The second via pads 623VP2 are connected to the plugs (G2P of FIG. 12A) of the second group, and connected to the ends of the kth to nth conductive patterns (CPk to CPn of FIG. 12A) of the second stepped stack structures (ST2 of FIG. 12A). The second via pads 623VP2 may be formed on and connected to the plugs (G2P of FIG. 12A) of the second group to extend between the first via pads 623VP1. The second via pads 623VP2 may overlap the first stepped stack structures (ST1 of FIG. 12A). In this case, the second via pads 623VP2 may be formed in an L shape.

The second connecting lines 623LL2 include lines 623LL2A of a first group and lines 623LL2B of a second group. The lines 623LL2A of the first group are formed in a straight line shape on the first and second stepped stack structures (ST1 and ST2 of FIG. 12A), and overlap the ends of the first conductive patterns (CP1 of FIG. 12A) of the first and second stepped stack structures (ST1 and ST2 of FIG. 12A). Each of lines 623LL2B of the second group has a straight line portion and an extending portion leading from the straight line portion. The straight line portion is disposed between the lines 623LL2A of the first group to be parallel to the lines 623LL2A of the first group. The extending portion extends, from the straight line portion, toward the end of any one of the second to (k−1)th conductive patterns (CP2 to CPk−1 of FIG. 12A) of the first and second stepped stack structures (ST1 and ST2 of FIG. 12A).

Referring to FIGS. 11A, 11B, 11C, and 12B, the common source line 623CSL, the first drain contact plug 623DCT1, the via pads 623GVP1 of the first group, and the second connecting lines 623LL2 may be simultaneously formed. For example, the first upper insulating layer 593 covering the first and second stack structures (ST1 and ST2 of FIG. 12A) and the planarization insulating layer 551 is formed on the structure shown in FIG. 12A. After that, the common source line 623CSL, the first drain contact plug 623DCT1, the via pads 623GVP1 of the first group, and the second connecting lines 623LL2, which penetrate the first upper insulating layer 593, are formed. Accordingly, the common source line 623CSL, the first drain contact plug 623DCT1, the via pads 623GVP1 of the first group, and the second connecting lines 623LL2 are buried inside the first upper insulating layer 593 on the same level.

Figure 12C:
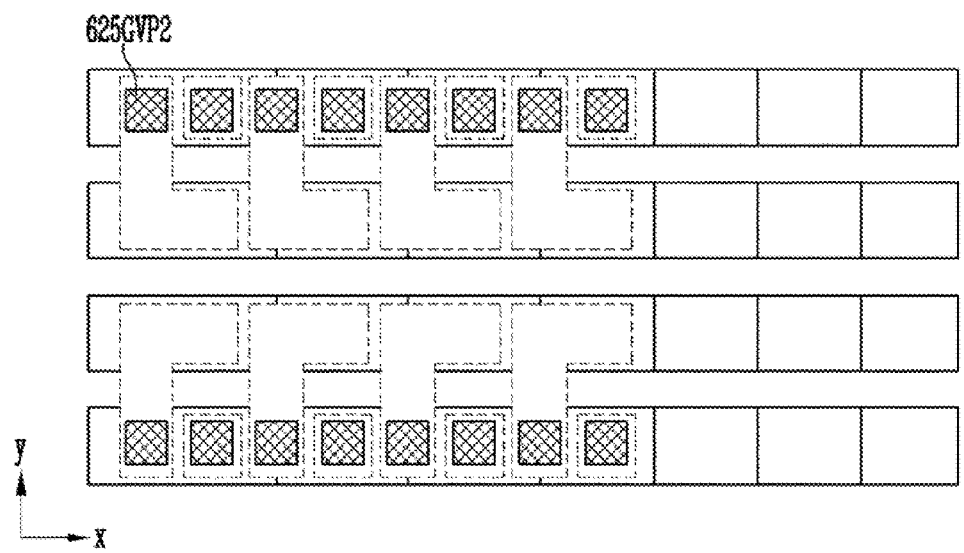

Referring to FIG. 12C, the via pads (or third via pads) 625GVP2 of the second group may be formed on and connected to the via pads 623GVP1 of the first group. The via pads 625GVP2 of the second group overlap the first stepped stack structures (ST1 of FIG. 12A) to be arranged along the extending direction (x direction) of the first stepped stack structures (ST1 of FIG. 12A).

Referring to FIGS. 11A, 11B, 11C, and 12C, the bit line contact plugs 625BCT and the via pads 625GVP2 of the second group may be simultaneously formed. For example, the second upper insulating layer 595 is formed to cover the first upper insulating layer 593. After that, the bit line contact plug 625BCT and the via pads 625GVP2 of the second group, which penetrate the second upper insulating layer 595, are formed. Accordingly, the bit line contact plug 625BCT and the via pads 625GVP2 of the second group are buried inside the second upper insulating layer 595 on the same level.

Figure 12D:
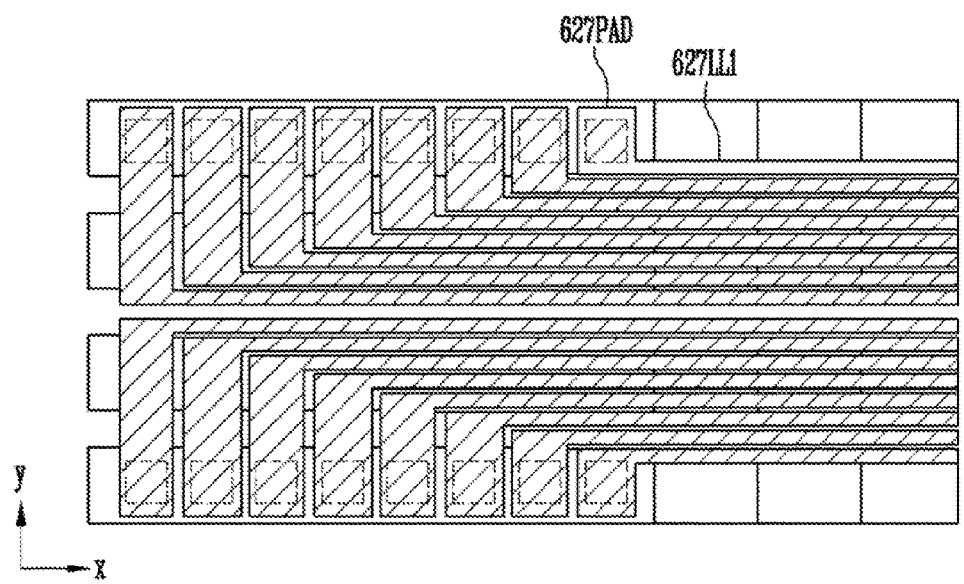

Referring to FIG. 12D, the contact pads 627PAD may be formed on and connected to the via pads 625GVP2 of the second group. The contact pads 627PAD may extend from the first connecting lines 627LL1 to overlap the first stepped stack structures (ST1 of FIG. 12A). The first connecting lines 627LL1 may be spaced apart from one another along the first direction (y direction), and extend in a straight line along the second direction (x direction) intersecting the first direction (y direction). The first connecting lines 627LL1 may include one end extending to further protrude in the second direction (x direction) as they get further away from the first stepped stack structures (ST1 of FIG. 12A).

According to the above-described structures of the first connecting lines 627LL1 and the via pads 625GVP2 of the second group, the contact pads 627PAD can be efficiently disposed within a limited area. The contact pads 627PAD may extend from one end of the first connecting lines 627LL1 formed in different lengths according to distances from the first stepped stack structures (ST1 of FIG. 12A). The contact pads 627PAD may extend toward the via pads 625GVP2 of the second group along the first direction (y direction) from the one end of the first connecting lines 627LL1.

Referring to FIGS. 11A, 11B, 11C, and 12D, the bit line 627BL, the contact pads 627PAD, and the first connecting lines 627LL1 may be simultaneously formed on the same level by using the SPT described in FIGS. 3A to 8B.

Figure 13:
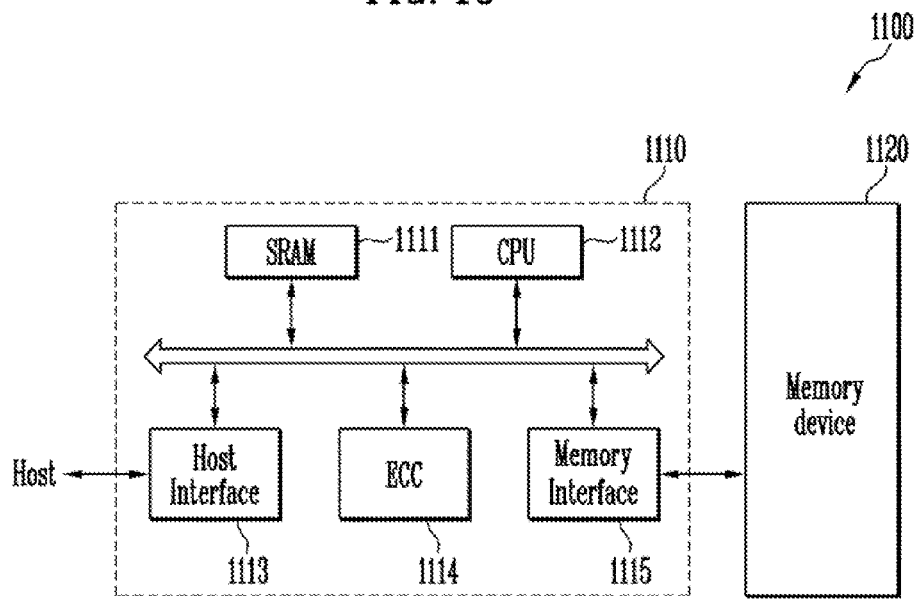
FIG. 13 is a configuration view illustrating a memory system according to an embodiment of the present invention.

FIG. 13 is a configuration view illustrating a memory system according to an embodiment of the present invention.

Referring to FIG. 13, the memory system 1100 according to the embodiment of the present invention includes a memory device 1120 and a memory controller 1110.

The memory device 1120 has the structures of the embodiments described in FIGS. 1A to 12D. Further, the memory device 1120 may be a multi-chip package formed of a plurality of flash memory chips.

The memory controller 1110 is configured to control the memory device 1120, and may include an SRAM 1111, a CPU 1112, a host interface 1113, an ECC 1114, and a memory interface 1115. The SRAM 1111 is used as an operation memory of the CPU 1112, and the CPU 1112 performs general control operations for data exchange of the memory controller 1110, and the host interface 1113 includes a data exchange protocol for a host connected with the memory system 1100. The ECC 1114 detects and corrects errors data read from the memory device 1120, and the memory interface 1115 interfaces with the memory device 1120. In addition, the memory controller 1110 may further include a ROM for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1110 may communicate with the outside (e.g., the host) through one among various interface protocols, such as USB, MMC, PCI-E, SATA, PATA, SCSI, ESDI, and IDE.

Figure 14:
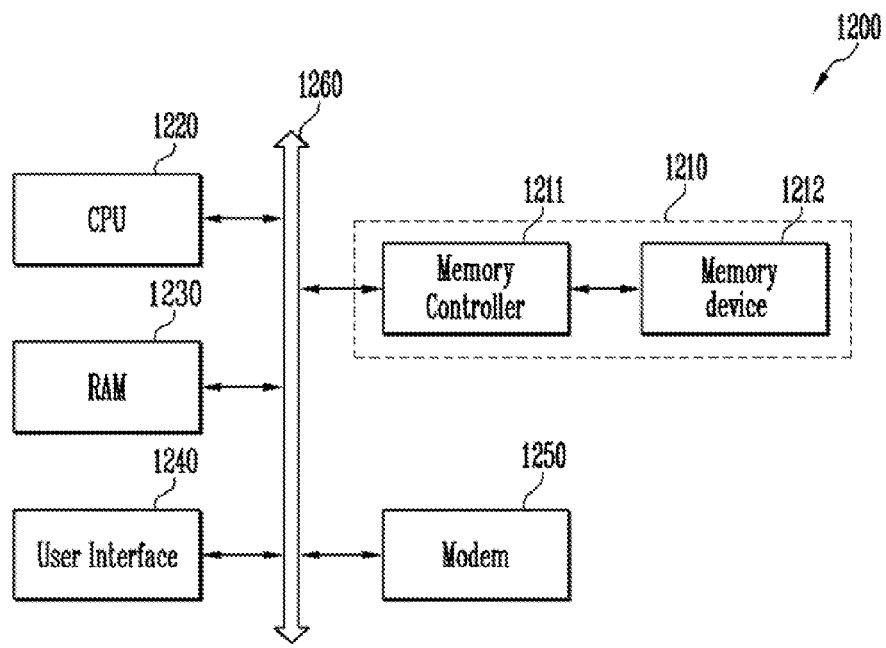
FIG. 14 is a configuration view illustrating a computing system according to an embodiment of the present invention.

FIG. 14 is a configuration view illustrating a computing system according to an embodiment of the present invention.

Referring to FIG. 14, the computing system 1200 according to the embodiment of the present invention may include a CPU 1220, a RAM 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 13, may be configured with a memory device 1212 and a memory controller 1211.

In the embodiments of the present invention, connecting lines connected to contact plugs are simultaneously formed with bit lines by using the SPT, so that it is unnecessary to perform any separate mask process for forming the connecting lines. Accordingly, it is possible to decrease the number of mask processes for semiconductor devices and reduce the manufacturing cost of the semiconductor devices.

In the embodiments of the present invention, connecting lines are formed using the SPT, so that the connecting lines can be formed with a pitch narrower than the exposure resolution limit. Accordingly, it is possible to increase the number of connecting lines formed on the same level within a limited area, thereby decreasing chip size.

In the embodiments of the present invention, the number of connecting lines formed on the same level as bit lines are increased, so that it is possible to sufficiently overcome an increase in the number of conductive patterns stacked in a stepped shape. Thus, since it is unnecessary to provide a separate line layer for connecting lines above bits lines, upper conductive patterns, other than the connecting lines, are formed above the bit lines with a sufficiently large size, so that the resistance of the upper conductive patterns can be lowered.

In the embodiments of the present invention, one end of connecting lines are formed to further protrude as they become more distant from outermost portions of a memory block, so that contact pads extending toward stepped stack structures disposed at the outermost portions of the memory block can be efficiently disposed within a limited area.

Sample embodiments have been disclosed herein, and although specific terms are employed, they are used and are to be interpreted in a generic and descriptive sense only and not for limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
   stepped stack structures each including first to nth conductive patterns sequentially stacked with exposed ends, the stepped stack structures being separated by slits and arranged along a first direction to constitute a memory block, wherein the n is a natural number;
   first connecting lines disposed on the stepped stack structures, and spaced apart from one another along the first direction, while extending along a second direction intersecting the first direction, wherein one ends of the first connecting lines further protrude in the second direction as the first connecting lines get further away from first stepped stacked structures at outermost portions of the memory block; and
   contact pads extending along the first direction from the one ends of the first connecting lines to overlap the first stepped stack structures.

2. The semiconductor device of claim 1, further comprising:
   first contact plugs connected to the ends of the kth to nth conductive patterns and extending along a stacking direction of the conductive patterns, wherein the k is a natural number less than the n;
   first via pads disposed on and connected to a first group of the first contact plugs, connected to the conductive patterns of the first stepped stack structures;
   second via pads disposed on and connected to a second group of the first contact plugs, connected to the conductive patterns of second stepped stack structures disposed between the first stepped stack structures, wherein the second via pads are formed on the same level as the first via pads; and
   third via pads overlapping the first stepped stack structures and connected between the first and second via pads and the contact pads.

3. The semiconductor device of claim 2, wherein the second via pads are formed in an L shape.

4. The semiconductor device of claim 2, further comprising:
   second contact plugs connected to the ends of the first to (k−1)th conductive patterns and extending along the stacking direction of the conductive patterns; and
   second connecting lines formed on and connected to the second contact plugs on the same level as the first via pads.

5. The semiconductor device of claim 4, wherein the second connecting lines include:
   a first group of lines overlapping the ends of the first conductive patterns to be formed in a straight line on the first and second stepped stack structures; and
   a second group of lines each having a straight line portion parallel to the lines of the first group and an extending portion extending toward the end of any one of the second to (k−1)th conductive patterns from the straight line portion.

6. The semiconductor device of claim 4, further comprising:
   source-side channel layers penetrating one or more among the first and second stepped stack structures; and a common source line connected to the source-side channel layers, and formed on the same level as the second connecting lines.

7. The semiconductor device of claim 1, further comprising:
- drain-side channel layers penetrating one or more among the first and second stepped stack structures; and
- bit lines connected to the drain-side channel layers, extending along the first direction, and formed on the same level as the first connecting lines and the contact pads.

8. The semiconductor device of claim 7, wherein the first connecting lines and the bit lines are arranged with the same pitch.

\* \* \* \* \*